(12) United States Patent
Katori et al.

(10) Patent No.: US 7,988,834 B2
(45) Date of Patent: *Aug. 2, 2011

(54) CONDUCTIVE CATALYST PARTICLES AND PROCESS FOR PRODUCTION THEREOF, GAS-DIFFUSING CATALYTIC ELECTRODE, AND ELECTROCHEMICAL DEVICE

(75) Inventors: Kenji Katori, Kanagawa (JP); Toshiaki Kanemitsu, Kanagawa (JP); Katsuya Shirai, Kanagawa (JP)

(73) Assignee: Sony Corporation, Tokyo (JP)

( * ) Notice: Subject to any disclaimer, the term of this patent is extended or adjusted under 35 U.S.C. 154(b) by 878 days.

This patent is subject to a terminal disclaimer.

(21) Appl. No.: 10/479,188

(22) PCT Filed: May 24, 2002

(86) PCT No.: PCT/JP02/05035
§ 371 (c)(1),
(2), (4) Date: Jan. 21, 2004

(87) PCT Pub. No.: WO02/098561
PCT Pub. Date: Dec. 12, 2002

(65) Prior Publication Data
US 2004/0142230 A1    Jul. 22, 2004

(30) Foreign Application Priority Data

Jun. 1, 2001   (JP) .................. P2001-166646
Jun. 29, 2001  (JP) .................. P2001-198280
Apr. 30, 2002  (JP) .................. P2002-128199

(51) Int. Cl.
C23C 14/34    (2006.01)
(52) U.S. Cl. ............ 204/192.15; 204/192.12; 427/115; 427/215; 427/212

(58) Field of Classification Search ............. 204/192.12, 204/192.15; 427/115, 215, 212
See application file for complete search history.

(56) References Cited

U.S. PATENT DOCUMENTS
4,536,482 A * 8/1985 Carcia ................. 502/5
(Continued)

FOREIGN PATENT DOCUMENTS
CA    2269643    10/1999
(Continued)

OTHER PUBLICATIONS
Machine Translations of 2000-109969 and 2001-087666.*
(Continued)

*Primary Examiner* — Rodney G McDonald
(74) *Attorney, Agent, or Firm* — K&L Gates LLP

(57) ABSTRACT

Conductive catalytic particles which are composed of a conductive powder and a catalytic material adhering to the surface thereof are provided. The catalytic material is an alloy of a noble metal material with an additive material which is thermally solid-insoluble in the noble metal material, or an alloy of MI and MII, where MI denotes at least one species selected from noble metal elements, and MII denotes at least one specifies selected from Fe, Co, Ni, Cr, Al, Cu, Hf, Zr, Ti, V, Nb, Ta, W, Ga, Sn, Ge, Si, Re, Os, Pb, Bi, Sb, Mo, Mn, O, N, C, Zn, In, and rare earth elements. The conductive catalytic particles are produced by causing the noble metal material and the additive material or MI and MII to adhere at the same time to the surface of a conductive powder by physical vapor deposition. The conductive catalytic particles are not susceptible to sintering and are used for a gas-diffusing catalytic electrode and an electrochemical device provided therewith.

25 Claims, 20 Drawing Sheets

U.S. PATENT DOCUMENTS

| | | | | |
|---|---|---|---|---|
| 4,940,528 | A | * | 7/1990 | Oki et al. .................. 204/427 |
| 5,079,107 | A | | 1/1992 | Jalan |
| 5,559,065 | A | * | 9/1996 | Lauth et al. .................. 502/5 |
| 7,294,603 | B2 | * | 11/2007 | Katori et al. .................. 502/185 |
| 2002/0107140 | A1 | * | 8/2002 | Hampden-Smith et al. .. 502/185 |

FOREIGN PATENT DOCUMENTS

| | | | |
|---|---|---|---|
| DE | 19921942 A1 | * | 11/2000 |
| JP | 52-020990 | | 6/1976 |
| JP | 52-20990 | | 2/1977 |
| JP | 54-82394 | | 6/1979 |
| JP | 58-35872 | | 3/1983 |
| JP | SHO 59-016495 | | 4/1984 |
| JP | 61-8851 | | 1/1986 |
| JP | SHO 61-008851 | | 1/1986 |
| JP | 1-120770 | | 5/1989 |
| JP | 01-213961 | | 8/1989 |
| JP | 1-213961 | | 8/1989 |
| JP | HEI 04-358540 | | 12/1992 |
| JP | 5-36418 | | 2/1993 |
| JP | HEI 07-024775 | | 3/1995 |
| JP | 07-246336 | | 9/1995 |
| JP | 7-246336 | | 9/1995 |
| JP | 9-161811 | | 6/1997 |
| JP | 09-161811 | | 6/1997 |
| JP | HEI 10-069914 | | 10/1998 |
| JP | 2879649 | | 1/1999 |
| JP | 11-510311 | | 9/1999 |
| JP | 2000-012043 | * | 1/2000 |
| JP | 2000-109969 | * | 4/2000 |
| JP | 2000-293517 | | 10/2000 |
| JP | 2001-087666 | * | 4/2001 |
| JP | 2001-87666 | | 4/2001 |
| JP | 2002-110175 | | 4/2002 |
| WO | WO 97/21256 | | 6/1997 |

OTHER PUBLICATIONS

Long Y. Chiang et al., *Multi-hydroxy Additions onto C60 Fullerene Molecules*, J. Chem. Soc., 1992 pp. 1791-1793.

Long Y. Chiang et al., *Efficient Synthesis of Polyhydroxylated Fullerene Derivatives via Hydrolysis of Polycyclosulfated Precursors*, American Chem. Society, 1994, pp. 3960-3969.

Japanese Office Action issued Mar. 2, 2010, for corresponding Japanese Application No. 2007-291516.

* cited by examiner

SPUTTERING TARGET

FIG. 2A   FIG. 2B   FIG. 2C
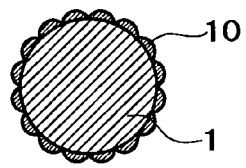 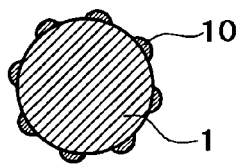 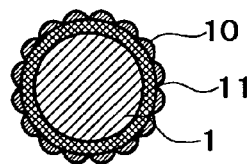
FIG. 3A
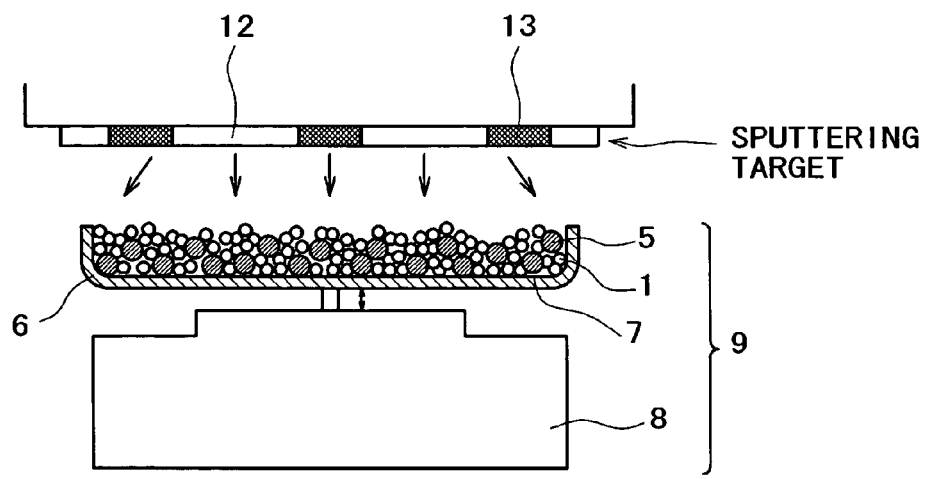
FIG. 3B
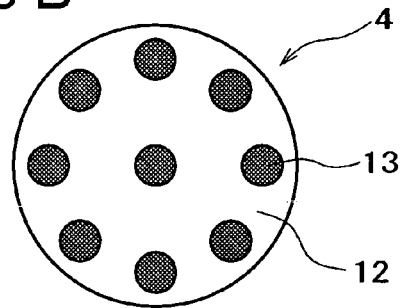

F I G. 7 A
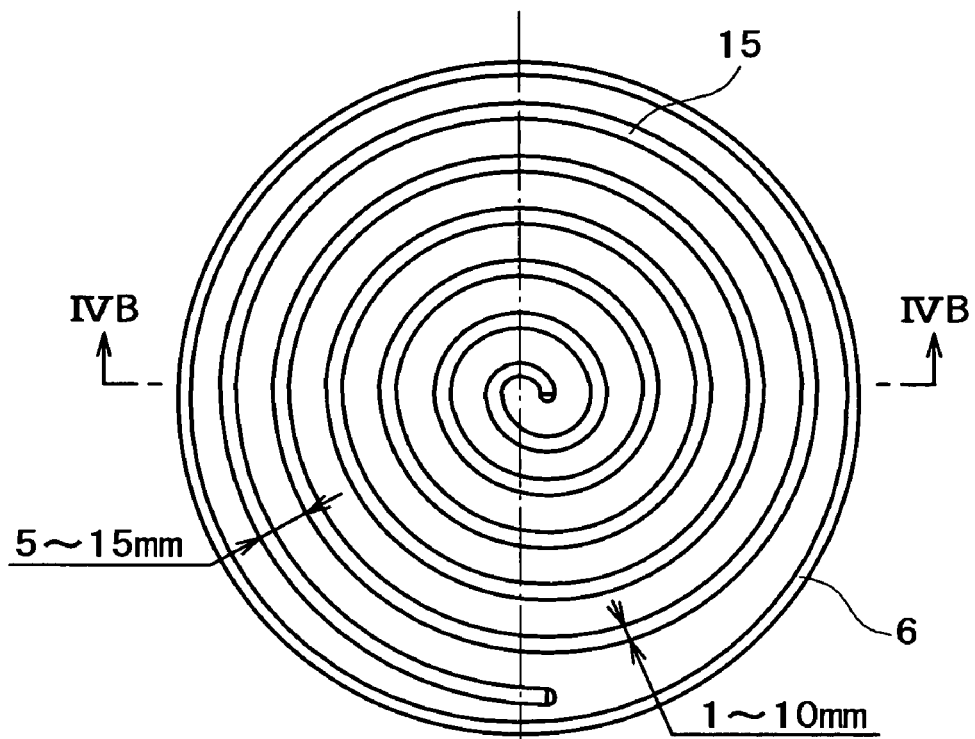
F I G. 7 B
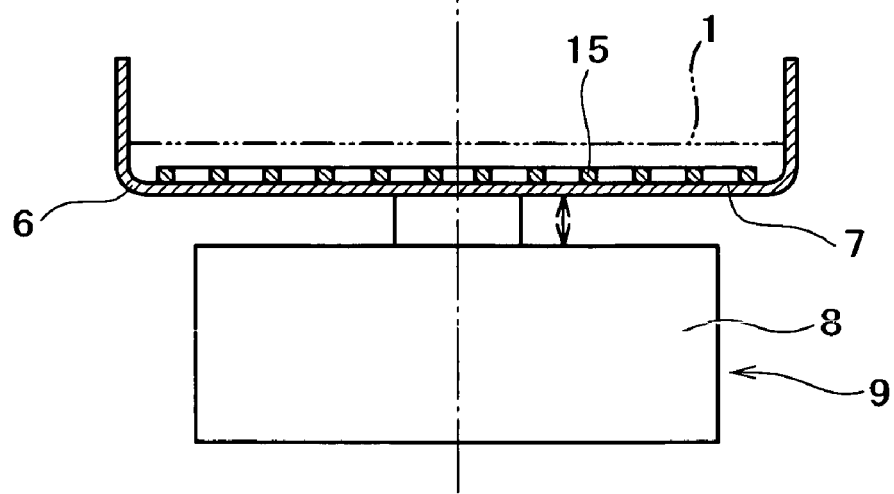

5~15mm   1~10mm $C_{60}(OH)_{12}$

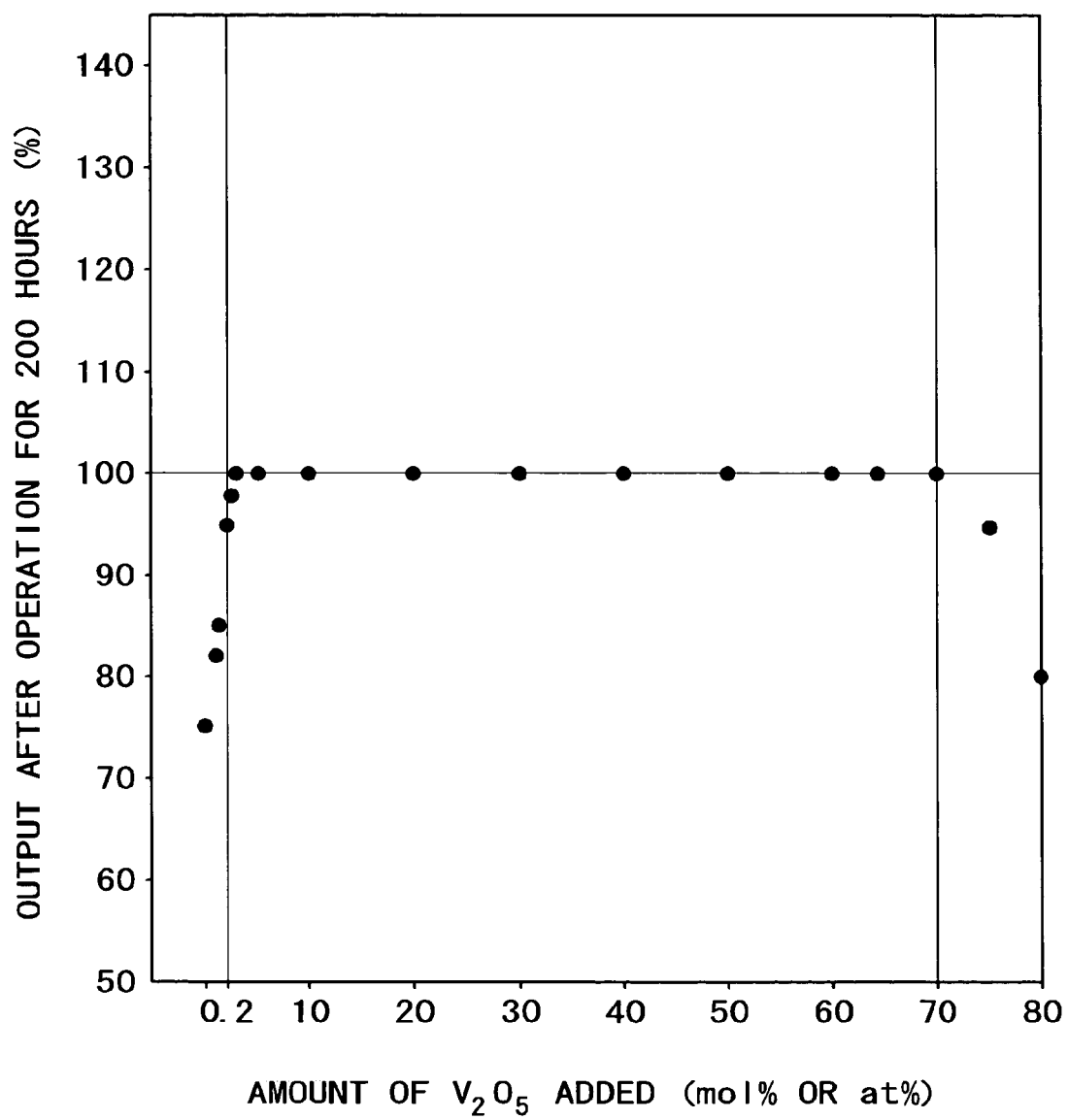
F I G. 1 7

F I G. 2 0
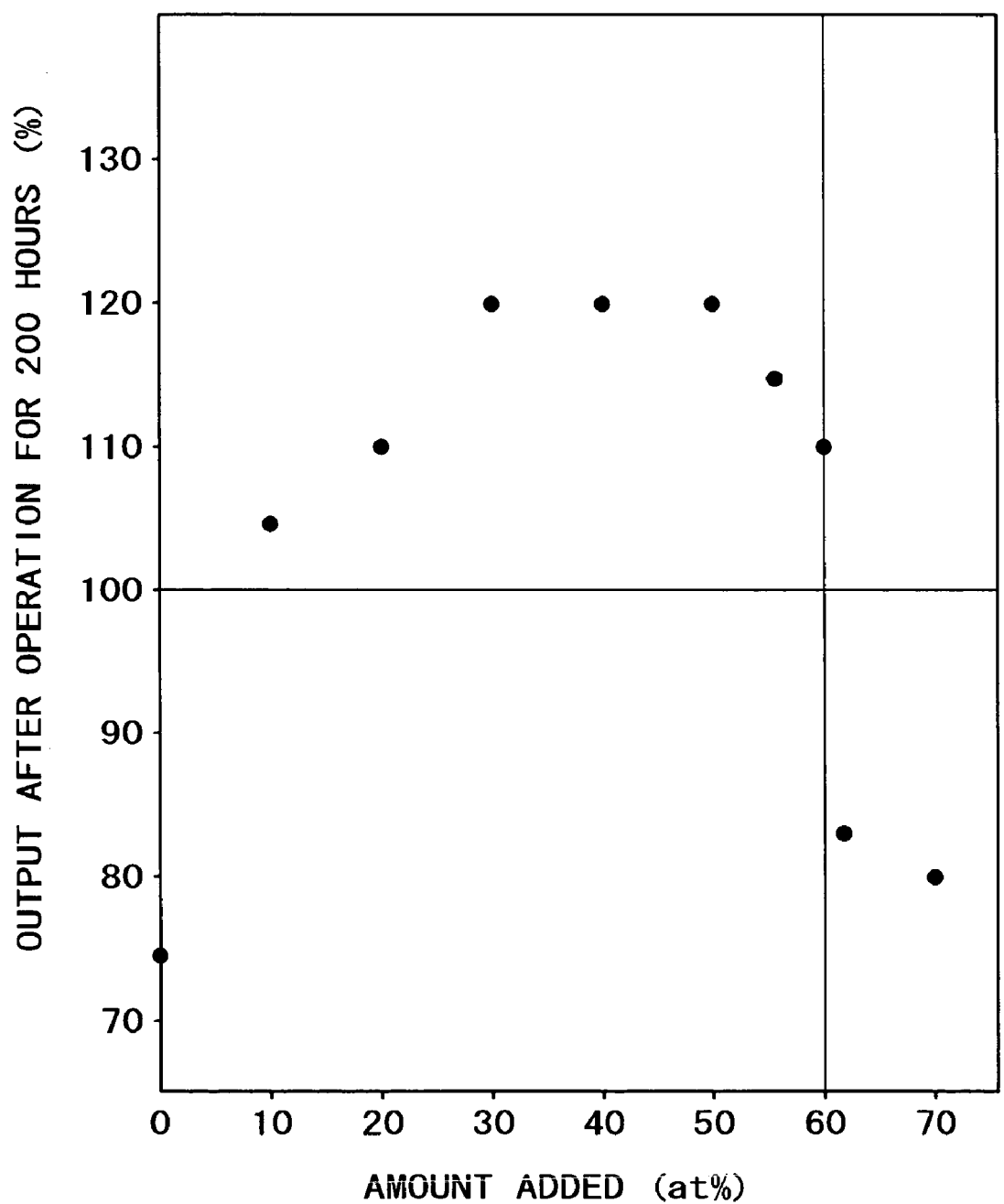

F I G. 2 2
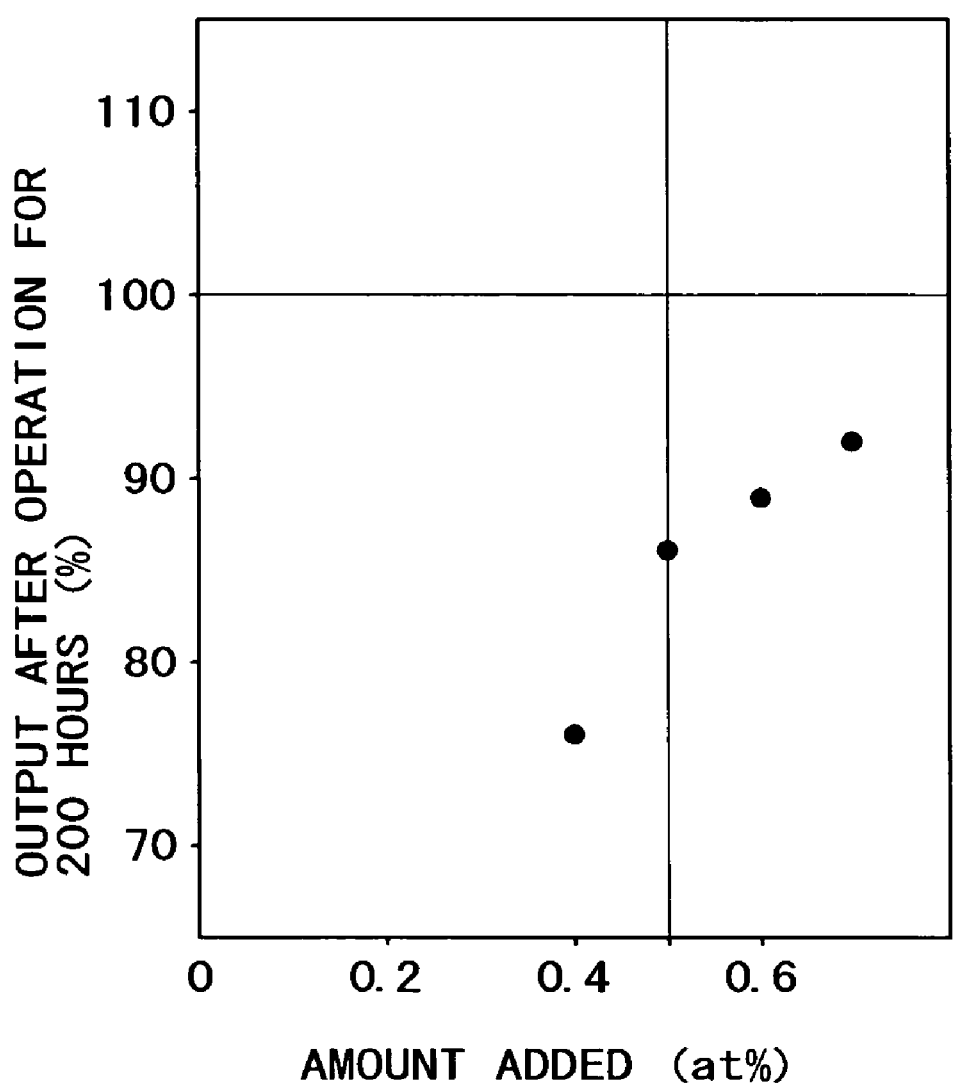

F I G. 2 3
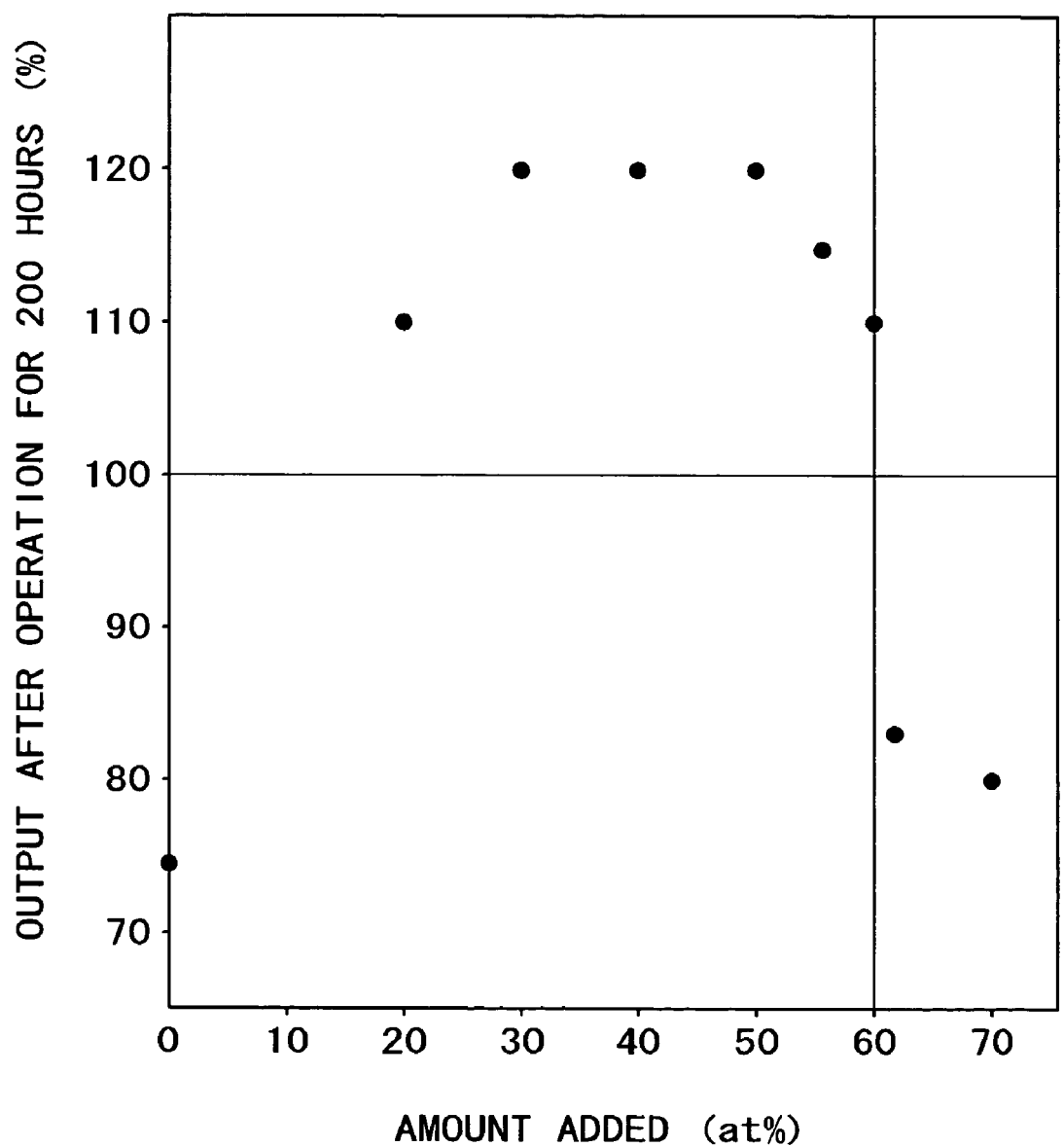

CONDUCTIVE CATALYST PARTICLES AND PROCESS FOR PRODUCTION THEREOF, GAS-DIFFUSING CATALYTIC ELECTRODE, AND ELECTROCHEMICAL DEVICE

CROSS REFERENCE TO RELATED APPLICATIONS

This patent application claims priority to Japanese Patent Document Nos. P2001-166646 filed on Jun. 1, 2001; P2001-198280 filed on Jun. 29, 2001; and P2002-128199 filed on Apr. 30, 2002, the disclosures of which are herein incorporated by reference.

BACKGROUND OF THE INVENTION

The present invention relates to conductive catalytic particles and a process for production thereof, a gas-diffusing catalytic electrode, and an electrochemical device.

The conventional gas-diffusing catalytic electrode is produced from catalytic particles (in the form of conductive carbon powder carrying platinum thereon as a catalyst), a water-repellant resin (such as fluorocarbon resin), and an ionic conductor, which are formed into a sheet as disclosed in Japanese Patent Laid-open No. Hei 5-36418 or applied to a carbon sheet.

The electrode thus produced may be used as an electrode for hydrogen decomposition as a constituent of a fuel cell of solid polymer type or the like. In this case, the catalyst (such as platinum) ionizes fuel, giving rise to electrons, which flow through the conductive carbon. The catalyst also ionizes hydrogen, giving rise to protons ($H^+$), which flow into the ionic conducting membrane through the ionic conductor. These actions need interstices for passage of gas, carbon that conducts electricity, an ionic conductor that conducts ions, and a catalyst (such as platinum) to ionize fuel and oxidant.

A usual way to make carbon powder (i.e., as a conductive powder) support platinum (i.e., as a catalyst) thereon is by dipping carbon powder in a solution containing platinum, such as in the form of ions, which is followed by reduction and thermal treatment. The thus processed carbon powder carries platinum fine particles on the surface thereof as disclosed, for example, in Japanese Patent No. 2879649.

The conventional process mentioned above, however, has the disadvantage of requiring steps for reduction and thermal treatment. With thermal treatment at an inadequately low temperature, it renders platinum poor in crystallinity, which results in failure of obtaining favorable catalytic characteristics.

As mentioned above, the catalyst such as platinum ionizes fuel, giving rise to electrons, which flow through the conductive carbon. The catalyst also ionizes hydrogen, giving rise to protons ($H^+$), which flow to the ion conducting membrane through the ionic conductor. Therefore, it is necessary that the carbon powder and the ionic conductor be kept in contact with each other. To this end, the carbon powder carrying platinum is usually coated with an ionic conductor. Unfortunately, the platinum which has been isolated from gas by the ionic conductor is not functional any longer because it functions only at its specific parts in contact with gas.

An alternative way is to coat the carbon powder with an ionic conductor and then load the coated carbon powder with platinum. This process, however, still needs thermal treatment to improve platinum in crystallinity. Thermal treatment at temperatures high enough for desired crystallinity deteriorates the ionic conductor which is usually poor in heat resistance.

FIG. 24A is a schematic sectional view showing a conductive catalytic particle that is produced by the conventional process, which consists of a carbon particle (conductive powder 1) and platinum particles 27 supported thereon. Also, FIG. 24B is a schematic sectional view showing a conductive catalytic particle, which is produced by coating a carbon particle with an ionic conductor 11 and then loading the coated carbon particle with platinum 27 thereon.

As shown in FIG. 24A, the conductive catalytic particle supporting platinum obtained from a liquid phase has platinum 27 thereon in spherical form. Therefore, the platinum 27 readily separate from the surface of carbon particle. Moreover, production in this manner requires a large amount of platinum. In addition, the platinum 27 in spherical form performs its catalytic function only on its surface but does not function inside. Therefore, it has a low catalytic efficiency for its quantity. Another problem is that the platinum 27 enters pores existing in the surface of the carbon particle (not shown.) Thus, the platinum 27 partly remains unfunctional and hence is poor in catalytic efficiency for its quantity.

In the case where the carbon powder is coated with the ionic conductor 11 and then the coated carbon powder is loaded with the platinum 27, as shown in FIG. 24B, the resulting product needs thermal treatment to improve the platinum 27 in crystallinity, as mentioned above. Unfortunately, the ionic conductor 11 is usually poor in heat resistance and becomes deteriorated when heated at a sufficiently high temperature to improve the platinum 27 in crystallinity.

In order to address the problems, a gas-diffusing catalytic electrode which produces a good catalytic action with a small catalytic amount is disclosed in Japanese Patent Application No. 2000-293517.

This provides that physical vapor deposition, such as sputtering as shown in FIG. 25, makes platinum (as a catalyst) adhere to the surface of the carbon powder 1 (as a conductive powder), thereby giving rise to conductive catalytic particles in which the platinum 27 adheres to the surface of the carbon powder 1, as shown in FIG. 25.

In other words, physical vapor deposition yields conductive catalytic particles in which the platinum 27 adheres only to the surface of the carbon powder, as shown in FIG. 26A. The resulting product produces a good catalytic action with a small amount. In addition, the platinum 27 has a sufficiently large area for contact with gas. In other words, the platinum 27 has a large specific surface area that contributes to reaction and hence has improved catalytic performance.

As shown in FIG. 26B, the catalytic particle is composed of a carbon particle 1, an ionic conductor 11 adhering to the surface thereof, and platinum 27 adhering to the surface thereof. Since the platinum 27 is attached by physical vapor deposition, the resulting product does not need thermal treatment to improve the crystallinity of platinum, unlike the conventional process. Therefore, the platinum 27 can be attached without deteriorating the performance of the ionic conductor 11.

The advantage of coating the conductive powder with a catalyst by physical vapor deposition (such as sputtering) is that the resulting product has a highly pure catalyst (as compared with that obtained by the conventional chemical process) if the target for sputtering is selected from highly pure catalytic materials. However, the highly pure catalyst adhering to the surface of the conductive powder has the disadvantage of being subject to sintering between the catalytic particles. In other words, the catalytic particles used for a fuel cell exhibit high catalytic activity in the early stage. However, they decrease in catalytic activity due to sintering as temperature increases with the lapse of time. Another problem with sintering is that a fuel cell decreases in output if it has a gas-diffusing catalytic electrode based on the conductive catalytic particles containing a highly pure catalyst.

The catalyst increases in catalytic activity as the crystal particles decease in particle diameter. In the case of physical vapor deposition, the initial particle diameter of the catalyst is determined when the catalyst adheres to the conductive powder. However, a highly pure catalyst tends to increase in the crystal particle diameter. In order to obtain a catalyst with a high purity and a high catalytic activity, it is necessary to study how to reduce the crystal particle diameter of the catalyst.

The present invention relates to conductive catalytic particles and a process for production thereof, a gas-diffusing catalytic electrode, and an electrochemical device.

SUMMARY OF THE INVENTION

The present invention relates to conductive catalytic particles and a process for production thereof, a gas-diffusing catalytic electrode, and an electrochemical device.

The present invention provides conductive catalytic particles which exhibit desirable catalytic properties effectively without suffering sintering and a process for production thereof, a gas-diffusing catalytic electrode and a process for production thereof, and an electrochemical device.

The present inventors have found that preventing the catalytic material from suffering sintering requires that the catalytic material should not experience self-diffusion in its crystal lattice. The present inventions have also found that the internal self-diffusion can be avoided if an insoluble substance (which, even when heated, does not form alloy with a noble metal by solid solution) is compulsorily introduced into the crystal lattice of a noble metal, and the resulting product can be used as the catalytic material which is free of sintering. Their researches also led to the finding that the crystal grains of the catalytic material can be made fine if a solid-insoluble substance is compulsorily introduced into the crystal lattice of a noble metal as the catalytic material. The catalytic material containing such a solid-insoluble substance is inhibited from crystal growth, and hence it exhibits a good catalytic activity. The present invention is based on these findings.

The present invention, in an embodiment, is directed to conductive catalytic particles which are composed of a conductive powder and a catalytic material adhering to the surface thereof, the catalytic material being an alloy of a noble metal with an additive material which is thermally solid-insoluble in the noble metal. The conductive catalytic particles are referred to as "the first conductive catalytic particles pertaining to the present invention" hereinafter. The present invention is also directed to a process for producing conductive catalytic particles which includes coating the surface of a conductive powder with a noble metal and an additive material which is thermally solid-insoluble in the noble metal all together by physical vapor deposition, thereby giving conductive catalytic particles having a catalytic material adhering to the surface thereof which is an alloy of the noble metal and the additive material. This process is referred to as "the first process for producing conductive catalytic particles pertaining to the present invention" hereinafter.

The present invention, in an embodiment, is also directed to a gas-diffusing catalytic electrode which contains conductive catalytic particles which have a catalytic material adhering to the surface thereof which is an alloy of a noble metal and an additive material which is thermally solid-insoluble in the noble metal. This gas-diffusing catalytic electrode is referred to as "the first gas-diffusing catalytic electrode pertaining to the present invention.

According to an embodiment of the present invention, the conductive catalytic particles are produced by coating the surface of a conductive powder with a noble metal and an additive material which is thermally solid-insoluble in the noble metal all together by physical vapor deposition. The advantage of this production process is that the solid-insoluble additive material which originally does not form alloy with the noble metal even when heated can be compulsorily introduced into the crystal lattice of the noble metal. Thus, this production process yields the conductive catalytic particles with the catalytic material which is an alloy of the noble metal and the additive material adhering to the surface of the conductive powder. The thus obtained conductive catalytic particles are very little subject to sintering because the catalytic material contains the additive material so that the noble metal in the catalytic material is protected from self-diffusion in the crystal lattice. Incidentally, the conventional chemical process for adhesion does not give the alloy because it cannot introduce the solid-insoluble additive material into the noble metal.

The advantage of the process according to an embodiment is due to the fact that the surface of the conductive powder is coated with the noble metal and the additive material which is thermally solid-insoluble in the noble metal all together by physical vapor deposition. The process in this manner prevents the grain growth of the noble metal at the time of coating, which leads to an outstanding catalytic activity.

Another advantage of the process according to an embodiment is due to the fact that the surface of the conductive powder is coated with the catalytic material by physical vapor deposition. Physical vapor deposition permits a catalytic material with good crystallinity to deposit on the surface of the conductive powder at a low temperature. Therefore, the first conductive catalytic particles thus obtained produce a good catalytic activity with a less amount of catalytic material. In addition, the resulting catalytic material has a sufficiently large area for contact with gas such that it has a large specific surface area contributing to reaction. This leads to an improved catalytic activity.

The present invention in an embodiment is also directed to conductive catalytic particles which are composed of a conductive powder and a catalytic material adhering to the surface thereof, the catalytic material including an alloy of MI and MII, where MI denotes at least one species that includes a noble metal such as Pt, Ir, Pd, Rh, Au, and Ru, and MII denotes at least one species that includes, for example, Fe, Co, Ni, Cr, Al, Cu, Hf, Zr, Ti, V, Nb, Ta, W, Ga, Sn, Ge, Si, Re, Os, Pb, Bi, Sb, Mo, Mn, O, N, F, C, Zn, In, and rare earth elements. The conductive catalytic particles are referred to as "the second conductive catalytic particles pertaining to the present invention" hereinafter. The present invention in an embodiment is also directed to a process for producing conductive catalytic particles which comprises coating the surface of a conductive powder with the MI and the MII all together by physical vapor deposition, thereby giving conductive catalytic particles having a catalytic material adhering to the surface thereof which is an alloy of the MI and the MII. This process is referred to as "the second process for producing conductive catalytic particles pertaining to the present invention" hereinafter.

The present invention in an embodiment is also directed to a gas-diffusing catalytic electrode which contains conductive catalytic particles which have a catalytic material adhering to the surface thereof which is an alloy of the MI and the MII.

This gas-diffusing catalytic electrode is referred to as "the second gas-diffusing catalytic electrode pertaining to the present invention.

According to another embodiment of the present invention, the conductive catalytic particles are produced by coating the surface of a conductive powder with the MI and the MII species by physical vapor deposition. The advantage of this production process according to an embodiment is that the MII can be compulsorily introduced into the crystal lattice of MI. Thus, this production process yields the conductive catalytic particles with the catalytic material which is an alloy of the MI and the MII adhering to the surface of the conductive powder. The thus obtained conductive catalytic particles are very little subject to sintering because the catalytic material contains the MII so that the MI in the catalytic material is protected from movement of dislocations and self-diffusion in the crystal lattice.

The advantage of the process is due to the fact that the surface of the conductive powder is coated with the catalytic material by physical vapor deposition. Physical vapor deposition permits a catalytic material with good crystallinity to deposit on the surface of the conductive powder at a low temperature. Therefore, the second conductive catalytic particles thus obtained produce a good catalytic activity with a less amount of catalytic material. In addition, the resulting catalytic material has a sufficiently large area for contact with gas or has a large specific surface area contributing to reaction. This leads to an improved catalytic activity.

The present invention in an embodiment is also directed to an electrochemical device which comprises at least two electrodes and an ionic conductor held between these electrodes, with at least one of the electrodes being the first or second gas-diffusing electrode pertaining to the present invention.

The electrochemical device according to an embodiment of the present invention, in which at least one of the electrodes is the first or second gas-diffusing electrode, produces the effect of preventing the occurrence of sintering. Therefore, it has good output characteristics and keeps them over a long period of time.

Additional features and advantages of the present invention are described in, and will be apparent from, the following Detailed Description of the Invention and the figures.

BRIEF DESCRIPTION OF THE FIGURES

FIGS. 2A to 2C are schematic sectional views showing the conductive catalytic particles according to an embodiment of the present invention.

FIGS. 3A and 3B are schematic sectional views showing the apparatus used for production of the conductive catalytic particles according to an embodiment of the present invention.

FIGS. 7A and 7B are schematic sectional views showing the vibrating device in the apparatus mentioned above according to an embodiment of the present invention.

FIG. 17 is a diagram showing the relation between the amount of $V_2O_5$ added and the output after operation for 200 hours in an embodiment of the present invention.

FIG. 20 is a diagram showing the relation between the amount of MII' added and the output after operation for 200 hours in an embodiment of the present invention.

FIG. 22 is a diagram showing the relation between the amount of MII (which is a mixture of MII' and MII") added and the output after operation for 200 hours in an embodiment of the present invention.

FIG. 23 is a diagram showing the relation between the amount of MII (which is a mixture of MII' and MII") added and the output after operation for 200 hours in an embodiment of the present invention.

DETAILED DESCRIPTION OF THE INVENTION

Figure 1A:
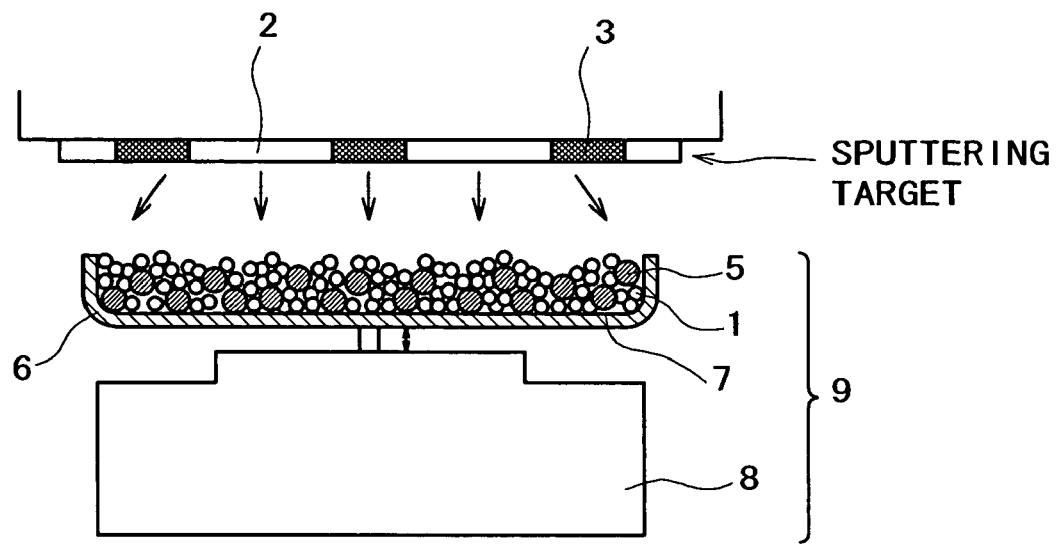
FIGS. 1A and 1B are schematic sectional views showing the apparatus used for production of the conductive catalytic particles according to an embodiment of the present invention.

The present invention relates to conductive catalytic particles and a process for production thereof, a gas-diffusing catalytic electrode, and an electrochemical device.

In the first production process according to an embodiment of the present invention, the physical vapor deposition mentioned above should preferably be sputtering which employs a target composed of the noble metal and additive material mentioned above. Sputtering permits easy production with high productivity and exhibits good film-forming performance.

The physical vapor deposition mentioned above may also be pulsed laser deposition in place of sputtering. Pulsed laser deposition permits easy control in film formation and exhibits good film-forming performance.

The conventional chemical process does not introduce the solid-insoluble additive material into the noble metal material. Therefore, it does not give the catalytic material based on the alloy. By contrast, the first process according to an embodiment of the present invention includes coating the surface of the conductive powder with the noble metal and the additive material which is thermally solid-insoluble in the noble metal all together by physical vapor deposition. Therefore, it can compulsorily introduce the solid-insoluble additive material which originally forms no alloy with the noble metal material even when heated into the crystal lattice of the noble metal material. Thus, the process yields the conductive catalytic particles having the catalytic material which is an alloy of the noble metal material and the additive material adhering to the surface of the conductive powder. The conductive catalytic particles are incorporated into the first gas-diffusing catalytic electrode according to an embodiment of the present invention, in which sintering hardly occurs because the additive material prevents the noble metal material from internal self-diffusion in the crystal lattice.

The first conductive catalytic particles pertaining to the present invention are produced by coating the surface of the conductive powder with the noble metal and the additive material which is thermally solid-insoluble in the noble metal all together by physical vapor deposition. This process prevents the noble metal material from growing in grain size at the time of deposition and the resulting product has an outstanding catalytic activity.

Moreover, the sputtering or pulsed laser deposition permits the catalytic material with good crystallinity to be deposited at a low temperature on the surface of the conductive powder. Therefore, the thus obtained first conductive catalytic particles according to an embodiment of the present invention produce a good catalytic activity with a less amount of the catalytic material. In addition, they ensure the catalytic material to have a sufficiently large area for contact with gas, and hence the catalytic material has a large specific surface area contributing to reaction. This leads to an improved catalytic activity.

Incidentally, the first process according to an embodiment of the present invention, which includes coating the surface of a conductive powder with the catalytic material, has the advantage over the process of forming noble metal film on a carbon sheet by sputtering, which is disclosed in Japanese Translations of PCT for Patent No. Hei 11-510311. The former process makes the catalytic substance have a larger specific surface area contributing to reaction than the latter process, and this leads to an improved catalytic performance.

The amount of the solid-insoluble additive material in an embodiment, to be added to the noble metal material includes preferably about 2 to about 70 mol % or at % for effective prevention of sintering. If the amount of the additive material is less than about 2 mol % or at % which is too small amount, the effect of preventing sintering will be poor. If the amount of the additive material is more than about 70 mol % or at % which is too large amount, catalytic activity will be poor.

The solid-insoluble additive material in an embodiment preferably includes ceramics, such as a ceramic that includes B (boron), silicon oxide (SiO and $SiO_2$), gallium oxide ($Ga_2O_3$), vanadium oxide ($V_2O_5$), tungsten oxide ($WO_3$) and/or the like. At least one them should be used.

When the physical vapor deposition, such as sputtering is carried out to coat the surface of the conductive powder with the noble metal material and the additive material which is thermally solid-insoluble in the noble metal material, it is desirable to vibrate the conductive powder. It is also desirable to coat the surface of the conductive material with the noble metal material and the additive material by the physical vapor deposition while vibrating the conductive material and vibrating amplifying means on a vibrating plane. Thus, the conductive powder is sufficiently vibrated and mixed, without staying at one place on the vibrating plane. Therefore, the conductive powder moves such that not only those particles in the outer layer but also those particles in the inner layer are exposed, and the conductive powder is uniformly coated with the catalytic material composed of the noble metal material and the additive material.

Figure 1B:
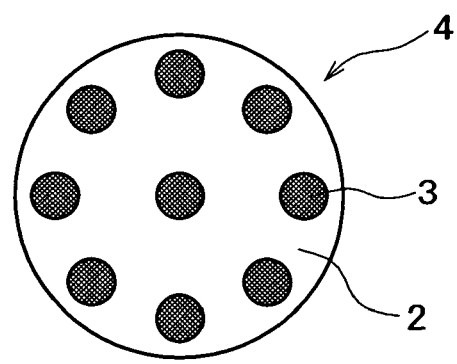

FIGS. 1A and 1B are schematic sectional views showing an example of the apparatus for production of the first conductive catalytic particles according to an embodiment of the present invention.

The apparatus shown in FIG. 1A is used for the physical vapor deposition, such as sputtering, which employs a target 4 that includes a noble metal material 2 and an additive material 3 to coat the surface of a conductive powder 1 with the catalytic material. This apparatus employs one or more vibration members including smoothly surfaced balls 5 as the vibration amplifying means. A mixture of the conductive powder 1 and the balls 5 is placed on the vibrating plane 7 in the container 6. The mixture should preferably be vibrated by means of the vibrator 8 of electromagnetic type or supersonic horn type. The vibrating device 9 constructed as mentioned above causes the conductive powder 1 and the balls 5 to collide and mix with each other and also causes the mixture to flow without staying at one place on the vibrating plane 7. Vibration causes the particles of the conductive powder 1 to be exposed regardless of whether they are in the upper layer or the inner layer in the container 6. Sputtering in this manner causes the catalytic material to adhere uniformly to all the particles of the conductive powder 1.

The balls 5 include in an embodiment ceramic, metallic and/or the like and about 1 to about 15 mm in diameter.

The target 4 as shown in FIG. 1B includes in an embodiment the noble metal material 2 and the additive material 3 incorporated thereinto. The additive material includes, for example, any of B (boron), silicon oxide (SiO and $SiO_2$), gallium oxide ($Ga_2O_3$), vanadium oxide ($V_2O_5$), tungsten oxide ($WO_3$) and/or the like. With the help of this target 4, the physical vapor deposition such as sputtering can compulsorily introduce the additive material 3 into the crystal lattice of the noble metal material 2.

The first conductive catalytic particles according to an embodiment of the present invention have the catalytic material 10 which is an alloy of the noble metal material and the additive material adhering to the surface of the conductive powder 1, as shown in FIG. 2A. The first gas-diffusing catalytic electrode according to an embodiment of the present invention, which contains the conductive catalytic particles, has the advantage that the additive material effectively prevents the internal self-diffusion in the crystal lattice of the noble metal material. Thus, the occurrence of sintering can be inhibited more effectively.

Moreover, the additive material prevents the grain growth of the noble metal material at the time of deposition on the surface of the conductive powder; therefore, the first conductive catalytic particles according to an embodiment of the present invention exhibit an outstanding catalytic activity.

Moreover, the catalytic material 10 achieves a good catalytic action in a less amount and provides a sufficient area for contact with gas, and hence provides a large specific surface area contributing to reaction. This leads to an improved catalytic performance.

Also, the catalytic material 10 which is an alloy of the noble metal material and the additive material may adhere unevenly to the surface of the conductive powder 1, as shown in FIG. 2B. In this case, too, the resulting product has the same desirable characteristic properties as the first conductive catalytic particles constructed as shown in FIG. 2A.

The process may be modified such that the surface of the conductive powder 1 is coated with an ionic conductor 11 and then the surface of the ionic conductor 11 undergoes the physical vapor deposition for deposition thereon of the catalytic material 10 which is an alloy of the noble metal material and the additive material, as shown in FIG. 2C. Unlike the conventional process, this process does not need thermal treatment to improve the crystallinity of the catalyst, and hence it permits the catalytic material 10 to be deposited without adverse effect on the performance of the ionic conductor 11.

Any of the first conductive catalytic particles according to an embodiment of the present invention as shown in FIGS. 2A to 2C is prepared such that the catalytic material 10 is deposited in an amount of 10-1000 wt % of the conductive powder 1 from the standpoint of desirable catalytic performance and good electrical conductivity. The noble metal material includes, for example, Pt, Ir, Rh, and/or the like.

On the other hand, the physical vapor deposition used in the second process pertaining to an embodiment of the present invention includes sputtering that employs a target composed of the MI and MII constituents. The sputtering process permits easy production with high productivity and is superior in film-forming performance.

Also, the physical vapor deposition may include pulsed laser deposition as well as the sputtering. The pulsed laser deposition process permits easy production with high productivity and is superior in film-forming performance.

Deposition by the conventional chemical process mentioned above resorts to diffusion by heating in order to introduce the MII into the MI. Heating increases the particle diameter owing to sintering. In contrast to the conventional chemical process, the second process pertaining to an embodiment of the present invention can compulsorily introduce the MII into the crystal lattice of the MI without heating, because it causes the MI and MII to adhere all together to the surface of the conductive powder by the physical vapor deposition such as sputtering. In this way it is possible to obtain the conductive catalytic particles having the catalytic material which is an alloy of the MI and MII adhering to the surface of the conductive powder. The second gas-diffusing catalytic electrode pertaining to an embodiment of the present invention, which contains the conductive catalytic particles, is by far less vulnerable to sintering because the MII prevents the internal self-diffusion of the crystal lattice of the MI.

Moreover, the sputtering or pulsed laser deposition permits the catalytic material with good crystallinity to adhere to the surface of the conductive powder at a low temperature. Therefore, the thus obtained second conductive catalytic particles pertaining to an embodiment of the present invention exhibits a good catalytic activity with a less amount of the catalytic material. They also permit the catalytic material to have a sufficiently large area for contact with gas. Thus, the catalytic material has a large specific surface area contributing to reaction. This leads to an improved catalytic performance.

The second process pertaining to an embodiment of the present invention, which causes the catalytic material to adhere to the surface of a conductive powder, is advantageous over the process disclosed in Japanese Translations of PCT for Patent No. Hei 11-510311 which is designed to form a film of noble metal on a carbon sheet by sputtering, because the catalytic material has a large specific surface area contributing to reaction. This can lead to an improved catalytic performance.

The catalytic material may be an alloy represented by MI-MII'-MII" where MI is at least one species selected from a noble metal elements such as Pt, Ir, Pd, Rh, Au, and Ru; MII' is at least one species that includes Fe, Co, Ni, Cr, Al, Sn, Cu, Mo, W, O, N, F and C; and MII" is at least one species that includes Hf, Zr, Ti, V, Nb, Ta, Ga, Ge, Si, Re, Os, Pb, Bi, Sb, Mn, and rare earth elements. The alloy includes in an embodiment a composition represented by $MI_a$-$MII'_b$-$MII"_c$ where a+b+c=100 at %, 0.5 at %≦b+c≦60 at %, b≦60 at %, c≦20 at % so that it effectively prevents sintering and exhibits good catalytic performance.

If the value of b+c is less than about 0.5 at %, the amount of MII' and MII" added is too small to prevent sintering. If the value of b+c is more than about 60 at %, the amount of MII' and MII" is too large for the adequate catalytic action. The second gas-diffusing catalytic electrode pertaining to an embodiment of the present invention which is used for a fuel cell will decrease the output of the fuel cell if it contains the conductive catalytic particles having an excessively large value of b+c.

It is desirable that the amount of the MII' that includes, for example, at least one species selected from Fe, Co, Ni, Cr, Al, Sn, Mo, Cu, W, O, N, F and C as the MII should be less than about 60 at %, so that the MII' produces a good catalytic performance and effectively prevents sintering, thereby improving the catalytic activity. With an amount exceeding about 60 at %, the catalytic performance and output are lowered because of too much addition of the MII'.

It is also desirable that the amount of the MII" that includes at least one species selected from Hf, Zr, Ti, V, Nb, Ta, B, Ga, Si, Re, Os, Pb, Bi, Sb, Mn, and rare earth elements as the MII should be less than about 20 at %, so that the MII" produces a good catalytic performance and effectively prevents sintering. With an amount exceeding about 20 at %, the catalytic performance and output are lowered because of too much addition of the MII.

It is desirable that the conductive powder should be vibrated when the MI and MII are deposited on the surface of the conductive powder by the physical vapor deposition such as sputtering. It is also desirable that the MI and MII should be deposited on the surface of the conductive powder by the physical vapor deposition while vibrating the conductive powder together with vibration amplifying means on a vibrating plane. In this way the conductive powder is thoroughly mixed by vibration without staying at one place on the vibrating plane. Therefore, the conductive powder moves such that not only those particles in the outer layer but also those particles in the inner layer are exposed, and all of the catalytic material which is an alloy of the MI and MII is uniformly deposited on the conductive powder.

FIGS. 3A and 3B are schematic sectional views showing one example of the apparatus for producing the second conductive catalytic particles pertaining to an embodiment of the present invention.

As shown in FIG. 3A, the apparatus is designed for sputtering as the physical vapor deposition process to cause the catalytic material to adhere to the surface of the conductive powder 1 by using the target 4 composed of MI 12 and MII 13. To achieve deposition with the catalytic material, it is desirable that the conductive powder 1 should be mixed with the balls 5 which are smoothly surfaced balls as the vibration amplifying means, and the resulting mixture should be placed on the vibrating plane 7 in the container 6. It is desirable that the vibration should be accomplished by means of the vibrator 8 which is of electromagnetic coil type or supersonic horn type. The vibrating device 9 constructed as mentioned above causes the conductive powder 1 and the balls 5 to collide each other and to flow without staying at one place on the vibrating plane 7. Vibration in this manner causes the layers of the conductive powder 1 to move such that not only those particles in the outer layer but also those particles in the inner layer are exposed in the container 6, so that the catalytic material is uniformly deposited on all of the conducive powder 1 by the sputtering.

The balls 5 should preferably be ceramic, metallic and/or the like and about 1 to about 10 mm in diameter.

The target 4 as shown in FIG. 3B should preferably be constructed such that the MII 13 is introduced into the MI 12. With the help of this target 4, the physical vapor deposition such as sputtering can compulsorily introduce the MII 13 into the crystal lattice of the MI 12 without heating.

Figure 4A:
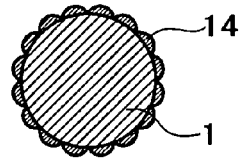
FIGS. 4A to 4C are schematic sectional views showing the conductive catalytic particles according to an embodiment of the present invention.

The second conductive catalytic particles pertaining to an embodiment of the present invention have the catalytic material 14 which is an alloy of the MI and MII adhering to the surface of the conductive powder 1, as shown in FIG. 4A. The second gas-diffusing catalytic electrode pertaining to an embodiment of the present invention, which contains the conductive catalytic particles, has the advantage that the MII effectively prevents the internal self-diffusion in the crystal lattice of the MI. Thus, the occurrence of sintering can be inhibited more effectively.

They also exhibit a good catalytic activity with a less amount of the catalytic material 14. They also permit the catalytic material 14 to have a sufficiently large area for contact with gas. Thus, the catalytic material 14 has a large specific surface area contributing to reaction. This leads to an improved catalytic performance.

Figure 4B:
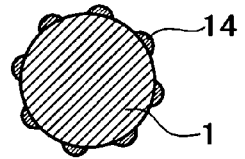

Also, the catalytic material 14 which is an alloy of the MI and MII may adhere unevenly to the surface of the conductive powder 1, as shown in FIG. 4B. In this case, too, the resulting product has the same desirable characteristic properties as the second conductive catalytic particles constructed as shown in FIG. 4A.

Figure 4C:
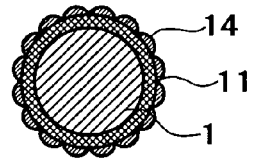

The process may be modified such that the surface of the conductive powder 1 is coated with an ionic conductor 11 and then the surface of the ionic conductor 11 undergoes the physical vapor deposition for deposition thereon of the catalytic material 14 which is an alloy of the MI and MII, as shown in FIG. 4C. Unlike the conventional process, this process does not need thermal treatment to improve the crystallinity of the catalyst, and hence it permits the catalytic material 14 to be deposited without adverse effect on the performance of the ionic conductor 11.

Any of the second conductive catalytic particles pertaining to an embodiment of the present invention as shown in FIGS. 4A to 4C should preferably be prepared such that the catalytic material 14 is deposited in an amount of about 10 to about 1000 wt % of the conductive powder 1 from the standpoint of good catalytic performance and good electrical conductivity.

Figure 5:
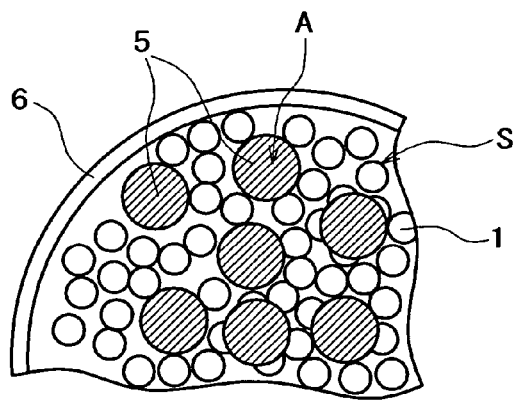
FIG. 5 is a partly enlarged schematic diagram showing the container in the apparatus used for production mentioned above according to an embodiment of the present invention.

FIG. 5 is a schematic diagram showing the container 6 containing the conductive powder 1 and the balls 5 as the vibration amplifying means. This container is used for production of the first or second conductive catalytic particles pertaining to the present invention.

As shown in FIG. 5, the conductive powder 1 and the balls 5 are mixed together in an embodiment such that the total area A of the balls account for about 30 to about 80% of the area S in which the conductive powder 1 is distributed. If this ratio is excessively small, satisfactory mixing is not achieved. Conversely, if this ratio is excessively large with a small proportion of the conductive powder 1, sputtering for adhesion of the catalytic material is poor in efficiency, which leads to a low productivity of the catalyst particles carrying the catalytic material.

Figure 6:
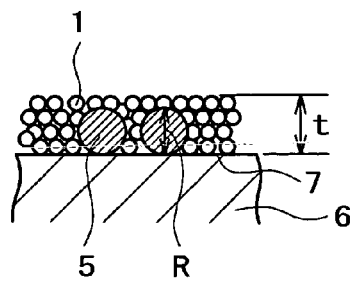
FIG. 6 is a partly enlarged schematic sectional view showing the apparatus mentioned above according to an embodiment of the present invention.

FIG. 6 is a partly enlarged schematic sectional view showing the container 6 which holds the conductive powder 1 and the balls 5 as the vibration amplifying means. As shown in FIG. 6, the balls 5 as the vibration amplifying means includes in an embodiment a diameter (R) which is equivalent to 10-70% of the layer thickness (t) of the conductive powder 1. The balls 5 with a diameter outside this range are undesirable as in the case of the surface ratio mentioned above.

The vibrator 8 applies vibration in an embodiment to the conductive powder 1 and the balls 5 as the vibration amplifying means at a frequency of about 5 to about 200 Hz and an amplitude of about 0.5 to about 20 mm for their thorough mixing. This applies to other embodiments mentioned later.

Under the preferable condition as described above, sputtering, for example, in combination with vibration permits the catalytic material to adhere more uniformly to the surface of the conductive powder than sputtering without vibration. With the ball diameter smaller than about 1 mm or larger than about 15 mm, the frequency less than about 5 Hz or more than about 200 Hz, or the amplitude less than ±0.5 mm, vibration does not shake the conductive powder effectively but permits it to stay on the bottom of the container. In this situation, uniform film formation cannot be achieved. Moreover, vibration with an amplitude in excess of 20 mm may force out the conductive powder, which leads to a decreased yield.

The first or second production process pertaining to an embodiment of the present invention may be modified such that the balls as vibration-amplifying means are replaced by an approximately flat gadget formed in an approximately spiral, concentric, or turned-around pattern. This gadget is fixed to the container, with at least part thereof remaining unfixed, such that the gadget itself is capable of free three-dimensional movement. The conductive powder may be placed on this gadget so that it undergoes vibration.

FIG. 7 is a schematic sectional view showing the vibrating device that can be used for the first or second production process pertaining to an embodiment of the present invention. The vibrating device in an embodiment is provided with the gadget 15 as the vibration-amplifying means which is approximately flat and is formed in an approximately spiral pattern.

Figure 8A:
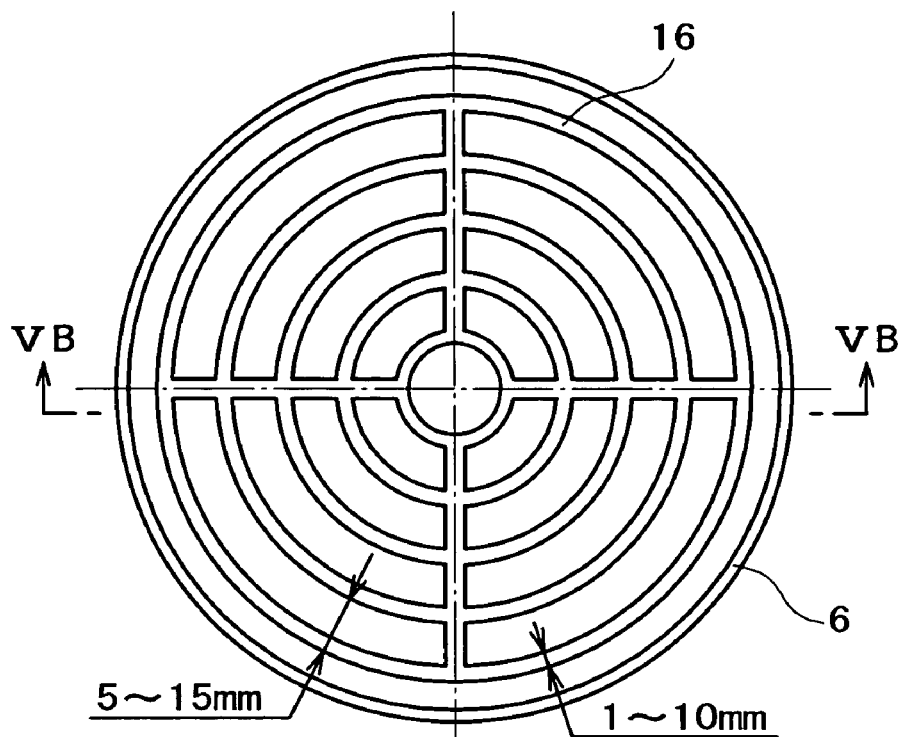
FIGS. 8A and 8B are schematic sectional views showing another vibrating device in the apparatus mentioned above according to an embodiment of the present invention.
Figure 8B:
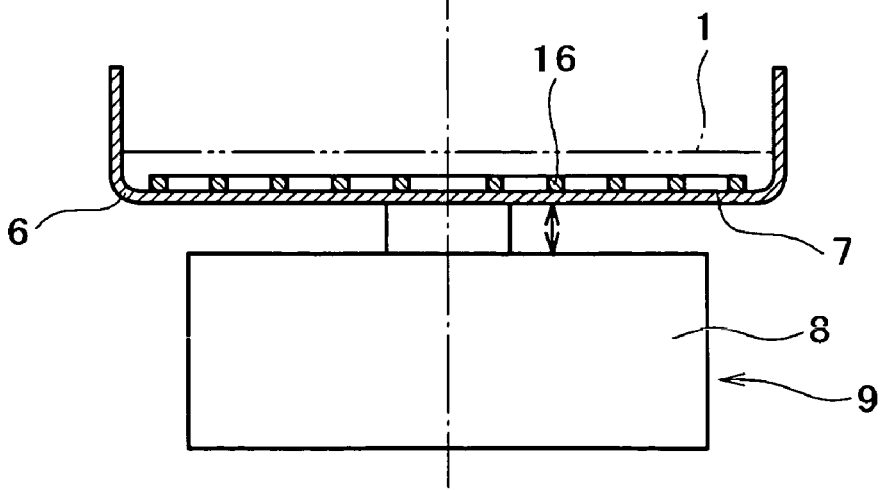

FIG. 8 is a schematic sectional view showing the vibrating device that can be used for the first or second production process pertaining to an embodiment of the present invention. The vibrating device in an embodiment is provided with the gadget 16 as the vibration-amplifying means which is approximately flat and is formed in an approximately concentric pattern with all the segments connected in the radial direction.

Figure 9A:
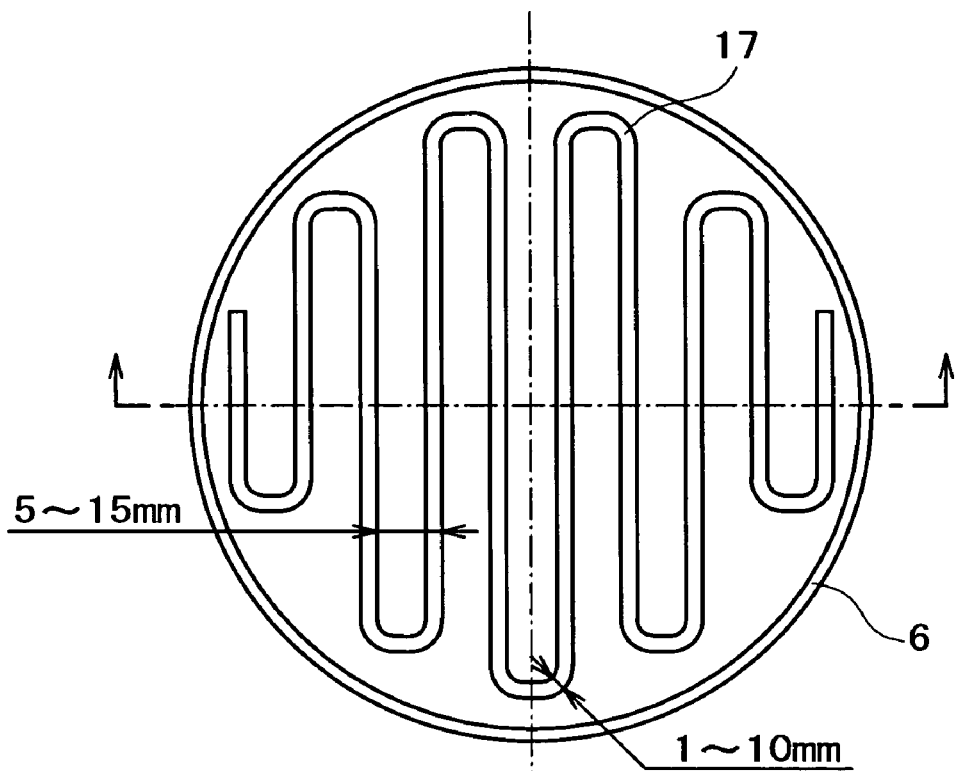
FIGS. 9A and 9B are schematic sectional views showing further another vibrating device in the apparatus mentioned above according to an embodiment of the present invention.
Figure 9B:
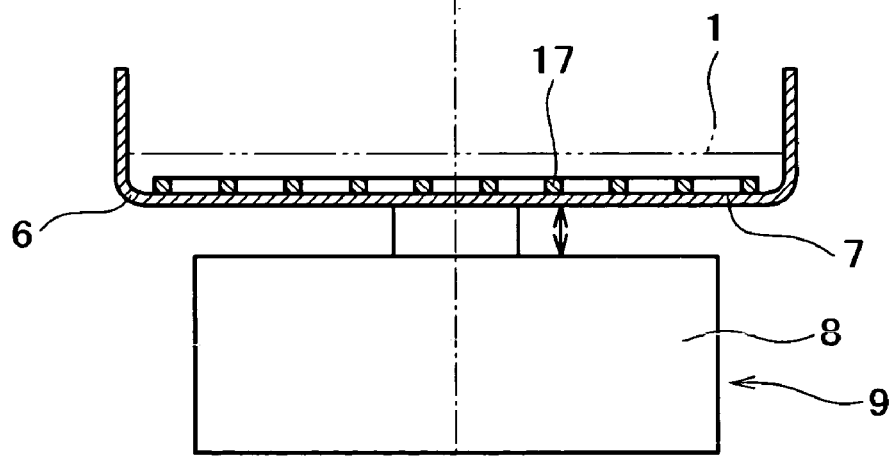

FIG. 9 is a schematic sectional view showing the vibrating device that can be used for the first or second production process pertaining to an embodiment of the present invention. The vibrating device in an embodiment is provided with the gadget 17 as the vibration-amplifying means which is approximately flat and is formed in an approximately turned-around pattern.

In all the cases shown in FIGS. 7 to 9, the gadget 15, 16, or 17 is installed in the container 6, with at least a part thereof unfixed. On the gadget 15, 16, or 17 is placed the conductive powder 1. When the container vibrates, the gadget 15, 16, or 17 also vibrates while keeping its shape. The vibrating gadget in turn causes the conductive powder 1 to fully vibrate and flow. During vibration, the conductive powder 1 in the container 6 undergoes the physical vapor deposition such as sputtering, so that the catalytic material is deposited on the surface thereof. In this way, the catalytic material is uniformly deposited on the entire conductive powder in both the upper and inner layers.

For the gadget formed in a spiral, concentric, turned-around pattern or the like to produce the desired effect, it includes in an embodiment a metal wire that ranges from about 1 to about 10 mm in diameter and it includes an outside diameter smaller by about 5 mm than the inside diameter of the container. In addition, the pattern provides in an embodiment that adjacent wires are about 5 to about 15 mm apart. The gadget not meeting these conditions does not achieve the thorough mixing of the conductive powder 1 and hence reduces the deposition of the catalytic material.

The gadget, which is approximately flat and is formed in an approximately spiral, concentric, or turned-around pattern, includes in an embodiment a thickness equivalent to about 10 to about 70% of the thickness of the layer of the conductive powder for the same reason as in the case where the balls are used.

The conductive powder 1 preferably includes in an embodiment an electrical resistance lower than about $10^{-3}$ $\Omega \cdot m$. It may be at least any one selected from carbon, ITO, and $SnO_2$. (ITO stands for Indium Tin Oxide; it is a conductive oxide composed of tin and indium oxide doped therein.)

Carbon as the conductive powder 1 preferably includes in an embodiment a specific surface area larger than 300 $m^2/g$. Any carbon not meeting this requirement would impair the characteristic properties of the conductive catalytic particles.

The first or second gas-diffusing catalytic electrode pertaining to an embodiment of the present invention, which is prepared from the first or second conductive catalytic particles pertaining to the present invention, depends heavily on gas permeability for its performance. The desirable gas permeability of carbon as the conductive powder 1 is indicated by an oil absorption value higher than about 200 mL/100 g.

The first or second conductive catalytic particles pertaining to an embodiment of the present invention may be formed alone into a catalyst layer by pressing or the like. However, it may also be formed into a film by binding with a resin. The resulting film is composed of a porous gas-permeable current collector and the conductive catalytic powder firmly adhering thereto. Such a film is desirable for production of the first or second gas-diffusing catalytic electrode pertaining to the present invention.

The first or second gas-diffusing catalytic electrode pertaining to an embodiment of the present invention may be composed substantially of the first or second conductive catalytic particles pertaining to the present invention. Alternatively, it may contain, in addition to the conductive catalytic particles, auxiliary components such as resin to bind them. In the latter case, the auxiliary components include in an embodiment a water-repellent resin such as fluorocarbon resin which contributes to binding performance and water drainage, a pore-forming agent such as $CaCO_3$ which contributes to gas permeability, and an ionic conductor which contributes to the mobility of protons and the like. Moreover, the first or second conductive catalytic particles are preferably in an embodiment supported on a porous gas-diffusing current collector, such as carbon sheet or the like.

The first or second gas-diffusing catalytic electrode pertaining to an embodiment of the present invention may be applied to electrochemical devices such as fuel cells and hydrogen generating apparatus.

In the case of an electrochemical device which is composed basically of a first electrode, a second electrode, and an ionic conductor held between these electrodes, the first or second gas-diffusing catalytic electrode pertaining to an embodiment of the present invention may be applied to at least the first one of the two electrodes.

To be more specific, the first or second gas-diffusing catalytic electrode may be suitably applied to an electrochemical device in which at least either of the first and second electrodes is a gas electrode.

Figure 10:
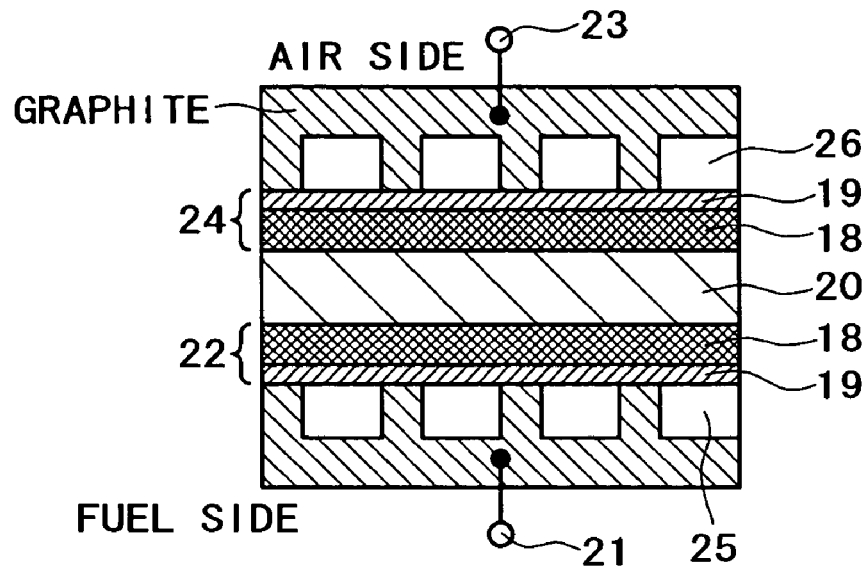
FIG. 10 is a schematic diagram showing the structure of the fuel cell provided with the gas-diffusing catalytic electrode according to an embodiment of the present invention.

FIG. 10 shows a typical example of fuel cells in which is used the first gas-diffusing catalytic electrode pertaining to an embodiment of the present invention. The catalyst layer 18 in FIG. 10 is formed from a mixture of the first conductive catalytic particles pertaining to an embodiment of the present invention and an optional ionic conductor, water-repellent resin (fluorocarbon resin), and pore-forming agent ($CaCO_3$). The first conductive catalytic particles pertaining to an embodiment of the present invention are composed of a conductive powder, such as carbon powder, and the catalytic material which is an alloy of the noble metal material, such as Pt and/or the like and the additive material such as B and/or the like adhering to the surface thereof. The first gas-diffusing catalytic electrode pertaining to an embodiment of the present invention is a porous gas-diffusing catalytic electrode which is composed of a catalyst layer 18 and a carbon sheet 19 as a porous gas-diffusing current collector. In an embodiment, the catalyst layer 18 effectively acts as the gas-diffusing catalytic electrode. Moreover, an ionic conductive portion 20 is held between the first and second electrodes, at least one of which is the first gas-diffusing catalytic electrode pertaining to an embodiment of the present invention.

This fuel cell has a negative electrode, such as fuel or hydrogen electrode, 22 connected to a terminal 21, and a positive electrode, such as oxygen electrode, 24 connected to a terminal 23, with an ionic conductive portion 20 held between them. The negative electrode and optionally the positive electrode also is the first gas-diffusing catalytic electrode pertaining to an embodiment of the present invention. When the fuel cell is in operation, hydrogen passes through the hydrogen passage 25 adjacent to the negative electrode 22. While passing through the passage 25, hydrogen (fuel) gives rise to hydrogen ions. These hydrogen ions, together with hydrogen ions generated by the negative electrode 22 and the ionic conductive portion 20, migrate to the positive electrode 24, at which they react with oxygen (air) passing through the oxygen passage 26. Thus, there is obtained an electromotive force as desired.

This fuel cell, which has the first gas-diffusing catalytic electrode pertaining to an embodiment of the present invention as the first and second electrodes, is hardly subject to sintering and is superior in catalytic activity. Moreover, it ensures the catalytic material a sufficiently large area for contact with gas such as hydrogen and/or the like. Thus, the catalytic material has a large specific surface area contributing reaction, and this leads to improved catalytic performance and good output properties. Another advantage is a high hydrogen ion conductivity, which results from the fact that dissociation of hydrogen ions takes place in the negative electrode 22 and the hydrogen ions supplied from the negative electrode 22 migrate to the positive electrode 24 while dissociation of hydrogen ions is taking place in the ionic conductive portion 20.

Figure 11:
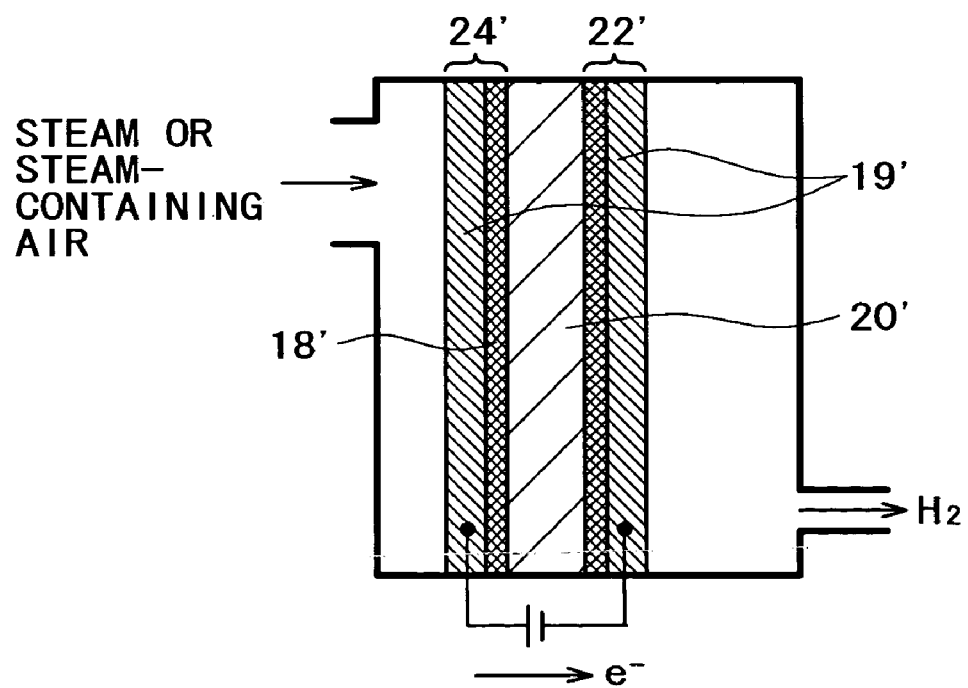
FIG. 11 is a schematic diagram showing the structure of the hydrogen generating unit provided with the gas-diffusing catalytic electrode according to an embodiment of the present invention.

FIG. 11 shows a typical example of hydrogen producing apparatus in which the first and second electrodes are based on the first gas-diffusing electrode pertaining to an embodiment of the present invention.

Reactions at each electrode take place as follows.

at positive electrode: $H_2O \rightarrow 2H^+ + \frac{1}{2}O_2 + 2e^-$
at negative electrode: $2H^+ + 2e^- \rightarrow H_2 \uparrow$ The necessary theoretical voltage is higher than 1.23 V.

The catalyst layer 18' in FIG. 11 is formed from the first conductive catalytic particles pertaining to an embodiment of the present invention, optionally in combination with an ionic conductor, a water-repellent resin, such as fluorocarbon resin and the like, and a pore-forming agent, such as $CaCO_3$ and the like. The first conductive catalytic particles pertaining to the present invention are composed of the conductive powder such as carbon powder and the like and an alloy of the noble metal material, such as Pt and the like and the additive material, such as B and the like which adheres in the form of film to the surface of the conductive powder. The first gas-diffusing catalytic electrode pertaining to the present invention is a porous gas-diffusing catalytic electrode which is composed of a catalyst layer 18' and a carbon sheet 19' as a porous gas-diffusing current collector. An ionic conductive portion 20' is held between the first and second electrodes which are the first gas-diffusing catalytic electrode pertaining to the present invention.

This hydrogen producing apparatus operates in such an way that the positive electrode 24' is supplied with steam or steam-containing air, which, upon decomposition at the positive electrode 24', gives rise to electrons and protons (hydrogen ions). The thus generated electrons and protons migrate to the negative electrode 22' for conversion into hydrogen gas. In this way there is obtained hydrogen gas as desired.

Since the hydrogen producing apparatus is constructed such that at least one of the first and second electrodes is the first gas-diffusing catalytic electrode pertaining to the present invention, it is hardly subject to sintering and permits protons and electrons necessary for hydrogen generation to move smoothly in the negative electrode 22'.

The first or second gas-diffusing catalytic electrode pertaining to an embodiment of the present invention is provided with an ionic conductive portion, or the electrochemical device has an ionic conductive portion held between the first and second electrodes. This ionic conductor includes, for example, NAFION (i.e., perfluorosulfonic acid resin made by DuPont) and fullerene derivative such as fullerenol, (polyfullerene hydroxide and the like.

Figure 12B:
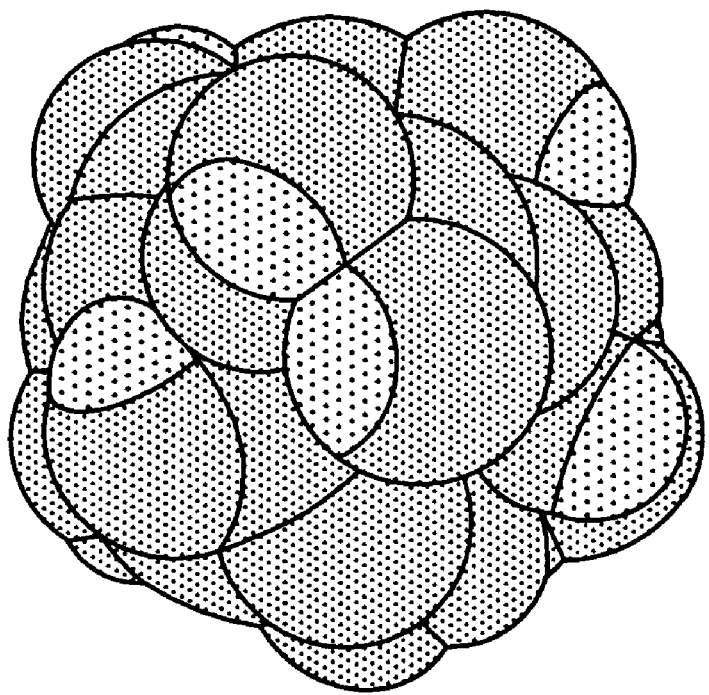
FIGS. 12A and 12B are diagrams showing the structure of the fullerene hydroxide as an example of fullerene derivatives which can be used according to an embodiment of the present invention.
Figure 12A:
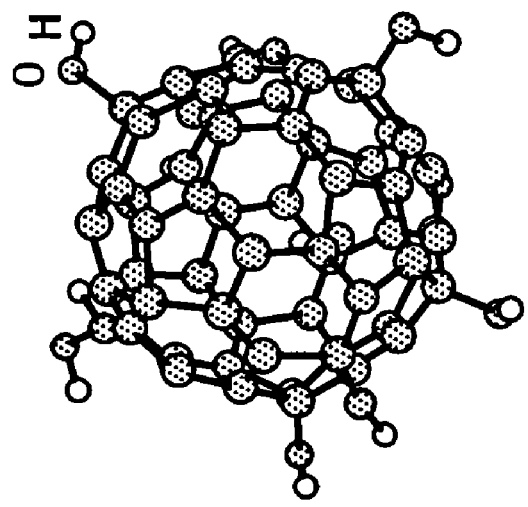

Fullerenol is fullerene having hydroxyl groups attached thereto, as shown in FIGS. 12A and 12B. The first synthesis of this compound was reported by Chiang et al. See, Chiang, L. Y.; Swirczewski, J. W.; Hsu, C. S.; Chowdhury, S. K.; Cameron, S.; and Creegan, K., J. Chem. Soc, Chem. Commun. 1992, 1791.

Figure 13A:
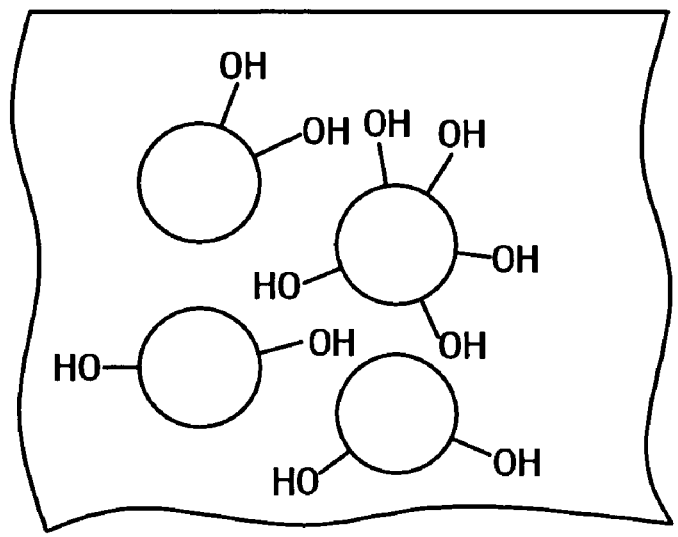
FIGS. 13A and 13B are schematic diagrams showing an example of the fullerene derivatives mentioned above according to an embodiment of the present invention.

Fullerenol can be formed into an aggregate so that hydroxyl groups in adjacent fullerenol molecules react with each other as shown in FIG. 13A in which a circle denotes a fullerene molecule. They became the first to find that the resulting aggregate as a macroscopic aggregate exhibits outstanding proton conducting characteristics or dissociation of $H^+$ from the phenolic hydroxyl group in the fullerenol molecule.

Figure 13B:
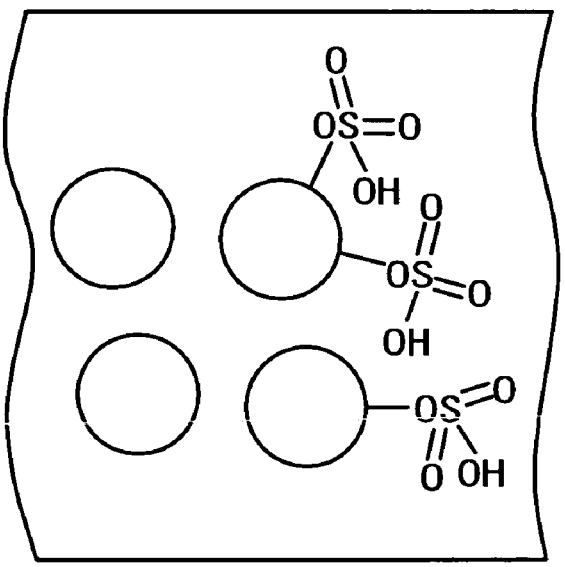

Moreover, the fullerenol as the ionic conductor may be replaced by an aggregate of fullerene having more than one $OSO_3H$ group. This fullerene derivative, in which OH groups are replaced by $OSO_3H$ groups, is hydrogensulfate-esterified fullerenol, as shown in FIG. 13B. It was also reported by Chiang et al. See, Chiang, L. Y.; Wang, L. Y.; Swirczewski, J. W.; Soled, S.; and Cameron, S., J. Org. Chem. 1994, 59, 3960. The hydrogensulfate-esterified fullerenol may have $OSO_3H$ groups alone in one molecule or both $OSO_3H$ groups and hydroxyl groups in one molecule.

An aggregate formed from a large number of molecules of fullerenol or hydrogensulfate-esterified fullerenol exhibits proton conductivity as the property of a bulk material. This proton conductivity directly involves migration of protons derived from a large number of hydroxyl groups which originally exist in molecules and $OSO_3H$ groups. Therefore, this proton conductivity does not need to rely on hydrogen or protons originating from steam molecules supplied from the atmosphere. In other words, the proton conductivity manifests itself without supply of water from the outside or absorption of moisture from the air. This permits continuous use even in a dry atmosphere regardless of the environment.

A probable reason for the significant proton conductivity of the fullerene derivatives mentioned above is that fullerene as the base shows conspicuous electrophilicity which greatly promotes the electrolytic dissociation of hydrogen ions from the hydroxyl groups as well as from the highly acidic $OSO_3H$ groups. In addition, the proton conductivity can be effectively increased because each fullerene molecule can accept a considerable number of hydroxyl groups and $OSO_3H$ groups, so that the number of protons involved in conduction is very large per unit volume of the conductor.

The fullerenol and hydrogensulfate-esterified fullerenol mentioned above are composed mainly of carbon atoms arising from fullerene. Therefore, they are light in weight, stable in quality, and free of contaminants. In addition, fullerene is rapidly decreasing in production cost. The foregoing makes fullerene a nearly ideal carbonaceous material standing above other materials from the standpoint of resource, environment, and economy.

Other fullerene derivatives than mentioned above may also be used, which have any of —COOH, —$SO_3H$, —OPO$(OH)_2$ and the like in place of —OH and —$OSO_3H$.

The fullerenol or fullerene derivative mentioned above may be obtained by treating fullerene powder with an acid or hydrolyzing fullerene. Any known process can attach desired groups to carbon atoms constituting fullerene molecules.

The ionic conductor which constitute the ionic conductive portion of the fullerene derivative may be in the form of simple body composed substantially of fullerene derivative alone or in the form of lump solidified with a binder.

The fullerene derivative may be made into a film by press-forming, so that the resulting film serves as the ionic conductor held between the first and second electrodes. This ionic conductor in film form may be replaced by the one (20 or 20') which is obtained from a lump of fullerene derivative solidified with a binder. In this case, the ionic conductor has a sufficient strength.

The binder mentioned above may be one or more than one kind of any known polymeric material capable of forming film. It includes in an embodiment in an amount less than about 20 wt % of the ionic conductive portion; it will deteriorate the conductivity of hydrogen ions if used in an amount more than about 20 wt %.

The ionic conductive portion composed of the fullerene derivative as an ionic conductor and a binder permits conduction of hydrogen ions in the same way as that composed of the fullerene derivative alone.

In addition, owing to the film-forming polymeric material contained therein, the former is stronger than the latter which is formed by compression from the fullerene derivative in powder form. It is a flexible ion-conducting thin film (usually thinner than about 300 μm) capable of blocking gas permeation.

The polymeric material mentioned above is not specifically restricted so long as it forms a film without inhibiting the hydrogen ion conductivity (by reaction with the fullerene derivative). It should preferably be one which is stable without electron conductivity. It includes, for example, polyfluoroethylene, polyvinylidene fluoride, polyvinyl alcohol, and the like which are desirable for reasons given below.

Polyfluoroethylene is desirable because it permits the fullerene derivative to be formed into a strong thin film more easily with a less amount than other polymeric materials. It produces in an embodiment its effect only with a small amount of about 3 wt %, preferably about 0.5 to about 1.5 wt % in the ionic conductive portion. It gives a thin film ranging from about 100 μm down to about 1 μm in thickness.

Polyvinylidene fluoride and polyvinyl alcohol are desirable because they give an ion-conducting thin film with a remarkable ability to block gas permeation. They can be used in an embodiment in an amount of about 5 to about 15 wt % in the ionic conductive portion.

Any of the polyfluoroethylene, polyvinylidene fluoride, polyvinyl alcohol and the like would adversely affect its film-forming performance if it is used in an amount less than the lower limit of the range mentioned above.

The thin film for the ionic conductive portion composed of the fullerene derivative and the binder may be obtained by any known film-forming process such as compression molding and extrusion molding.

EXAMPLES

The invention will be described in more detail with reference to the following examples. Examples 1 to 5 demonstrate an embodiment of the present invention, and Examples 6 to 12 demonstrate and other embodiment of the present invention.

Example 1

An apparatus shown in FIG. 1 was assembled from a sputtering target, a vibrator, and a container. The container was charged with a conductive powder and balls. The sputtering target (shown in FIG. 1B) is a platinum disk 100 mm in diameter, which is incorporated with boron (B) in such an amount that the film formed by sputtering contains as much boron as shown in Table 1 given below. The balls are stainless steel balls 3 mm in diameter. The conductive powder is a carbon powder having a surface area of 800 $m^2/g$ and an oil absorption value of 360 mL/100 g. Sputtering is conducted with the vibrator generating vibration with an amplitude of ±1 mm and a frequency of 36 Hz.

The container was charged with the carbon powder (1 g) and the stainless steel balls (35 g). Sputtering was carried out for 30 minutes while the carbon powder and stainless steel balls were being vibrated by the vibrator, with the vacuum chamber supplied with argon (at 1 Pa) and the target activated by 400 W RF. After sputtering, it was found that the carbon powder increased in weight to 1.66 g owing to deposition of a Pt/B alloy (0.66 g) thereon. This implies that the treated carbon powder carries the Pt/B alloy as much as 40 wt %.

A carbon sheet was coated with a mixture of teflon binder and carbon (not carrying platinum) dispersed in a solvent such that the coating layer was 20 μm thick after drying. This coating functions as a layer to prevent spreading.

Figure 14:
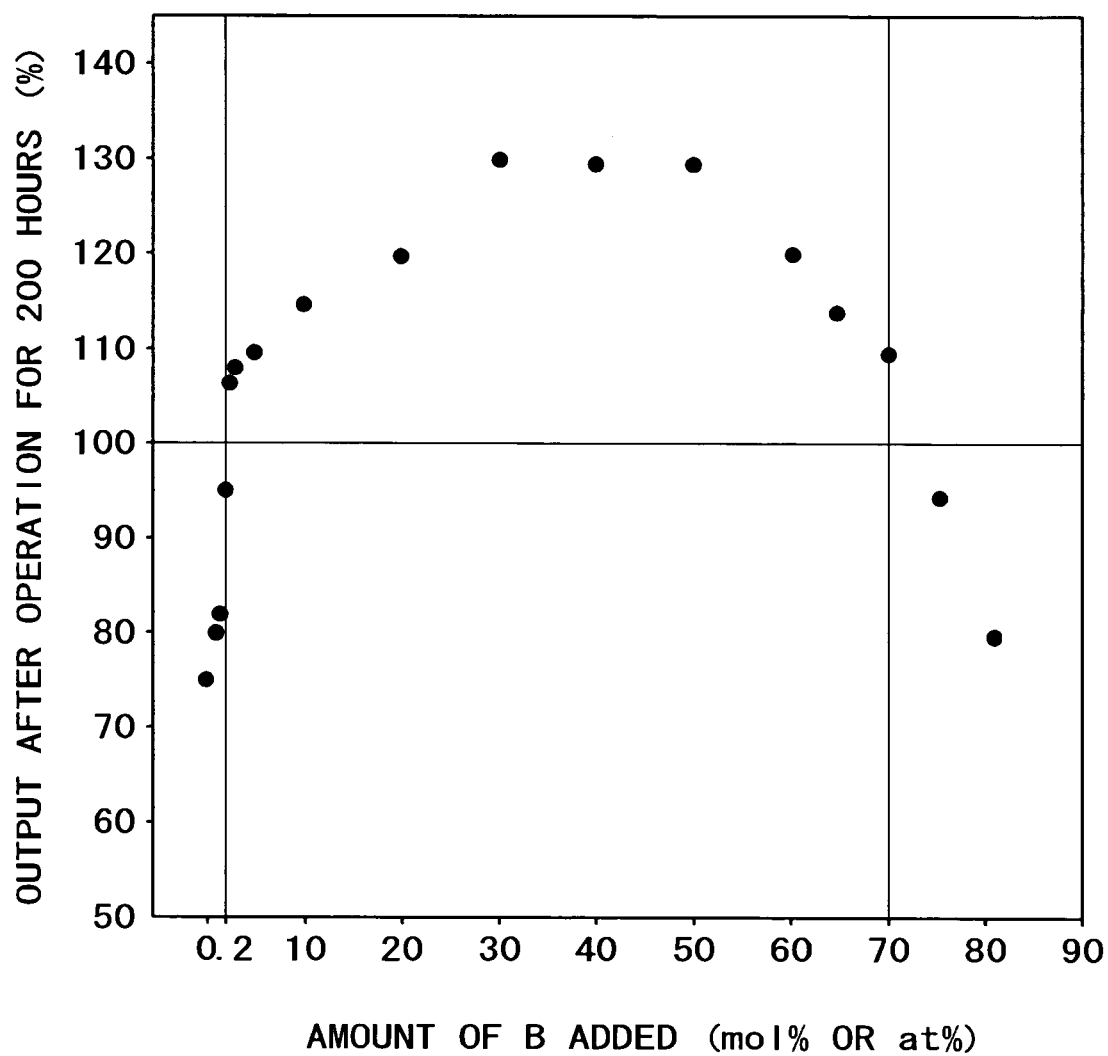
FIG. 14 is a diagram showing the relation between the amount of B added and the output after operation for 200 hours in an embodiment of the present invention.

The Pt/B alloy-carrying carbon powder, which was obtained as mentioned above, was mixed with perfluorosulfonic acid resin (as a binder) and n-propyl alcohol (as an organic solvent). The resulting mixture was applied to that side of the carbon sheet on which the layer to prevent spreading was formed. After drying, the coating layer was 10 μm thick. The thus obtained sheet was used in this example as the gas-diffusing catalytic electrode. A fuel cell as shown in FIG. 10 was made, in which the gas-diffusing catalytic electrode was placed on both sides of the ion-exchange membrane (of perfluorosulfonic acid resin). The resulting fuel cell was tested for initial output and output after operation for 200 hours. Several samples were prepared, in which the gas-diffusing catalytic electrode varies in the amount of boron. The results of measurements of output of each fuel cell are shown in Table 1 and FIG. 14 given below. Incidentally, the initial output (in terms of $mW/cm^2$) generated by the fuel cell which employs the gas-diffusing catalytic electrode containing no boron is regarded as the standard (100%) for relative values.

TABLE 1

| Element added | Amount added (at %) | Initial output (%) | Output after operation for 200 hours (%) |
|---|---|---|---|
| B | 0 | 100 | 75 |
| B | 1 | 100 | 80 |
| B | 1.5 | 100 | 82 |
| B | 2.0 | 105 | 95 |
| B | 2.5 | 107 | 107 |
| B | 3 | 108 | 108 |
| B | 5 | 110 | 110 |
| B | 10 | 115 | 115 |
| B | 20 | 120 | 120 |
| B | 30 | 130 | 130 |
| B | 40 | 130 | 130 |
| B | 50 | 130 | 130 |
| B | 60 | 120 | 120 |
| B | 65 | 115 | 115 |
| B | 70 | 110 | 110 |
| B | 75 | 95 | 95 |
| B | 80 | 80 | 80 |

It is shown that while Pt as the noble metal material and B as the additive material cannot be made into an alloy by chemical heating because B is solid-insoluble in Pt, they can be made into an alloy by the physical vapor deposition such as sputtering. It is also shown that the first gas-diffusing catalytic electrode pertaining to the present invention, which contains the first conductive catalytic particles pertaining to the present invention which are the conductive powder on the surface of which is deposited by sputtering the catalytic material which is an alloy of Pt as the noble metal material and B as the additive material, prevents the internal self-diffusion of Pt crystal lattice in the catalytic material and hence is hardly subject to sintering. Therefore, it is superior in catalytic activity and output characteristics to the one containing Pt alone.

In this Example, the carbon powder as the conductive powder and the balls as the vibration-amplifying means are placed on the vibrating plane, and the catalytic material is made to adhere to the surface of the carbon powder while they are being vibrated. Therefore, the carbon powder thoroughly vibrates, without staying at one place on the vibrating plane.

Thus, it is possible to make the catalytic material adhere uniformly to all of the carbon powder placed in the container.

In addition, it is apparent from Table 1 and FIG. 14 that sintering is effectively prevented if B as the additive material is added in a specific amount of 2-70 mol % or at %. This in turn leads to a good catalytic activity and a high output over a long period of time.

Example 2

The same procedure as in Example 1 was repeated to prepare a fuel cell as shown in FIG. 10, except that B was replaced by $SiO_2$ and the amount of $SiO_2$ was varied as shown in Table 2. The resulting fuel cells were tested for initial output and output after operation for 200 hours. The results are shown in Table 2 and FIG. 15. Incidentally, the initial output (in terms of $mW/cm^2$) generated by the fuel cell which employs the gas-diffusing catalytic electrode containing no $SiO_2$ is regarded as the standard (100%) for relative values.

TABLE 2

| Element added | Amount added (mol %) | Initial output (%) | Output after operation for 200 hours (%) |
|---|---|---|---|
| $SiO_2$ | 0 | 100 | 75 |
| $SiO_2$ | 1 | 100 | 82 |
| $SiO_2$ | 1.5 | 100 | 85 |
| $SiO_2$ | 2.0 | 107 | 100 |
| $SiO_2$ | 2.5 | 109 | 107 |
| $SiO_2$ | 3 | 110 | 108 |
| $SiO_2$ | 5 | 110 | 110 |
| $SiO_2$ | 10 | 115 | 115 |
| $SiO_2$ | 20 | 120 | 120 |
| $SiO_2$ | 30 | 130 | 130 |
| $SiO_2$ | 40 | 130 | 130 |
| $SiO_2$ | 50 | 130 | 130 |
| $SiO_2$ | 60 | 120 | 120 |
| $SiO_2$ | 65 | 115 | 115 |
| $SiO_2$ | 70 | 110 | 110 |
| $SiO_2$ | 75 | 95 | 95 |
| $SiO_2$ | 80 | 80 | 80 |

It is shown that while Pt as the noble metal material and $SiO_2$ as the additive material cannot be made into an alloy by chemical heating because $SiO_2$ is solid-insoluble in Pt, they can be made into an alloy by the physical vapor deposition such as sputtering. It is also shown that the first gas-diffusing catalytic electrode pertaining to the present invention, which contains the first conductive catalytic particles pertaining to an embodiment of the present invention which are the conductive powder on the surface of which is deposited by sputtering the catalytic material which is an alloy of Pt as the noble metal material and $SiO_2$ as the additive material, prevents the internal self-diffusion of Pt crystal lattice in the catalytic material and hence is hardly subject to sintering. Therefore, it is superior in catalytic activity and output characteristics to the one containing Pt alone.

In this Example, the carbon powder as the conductive powder and the balls as the vibration-amplifying means are placed on the vibrating plane, and the catalytic material is made to adhere to the surface of the carbon powder while they are being vibrated. Therefore, the carbon powder thoroughly vibrates, without staying at one place on the vibrating plane. Thus, it is possible to make the catalytic material adhere uniformly to all of the carbon powder placed in the container.

Figure 15:
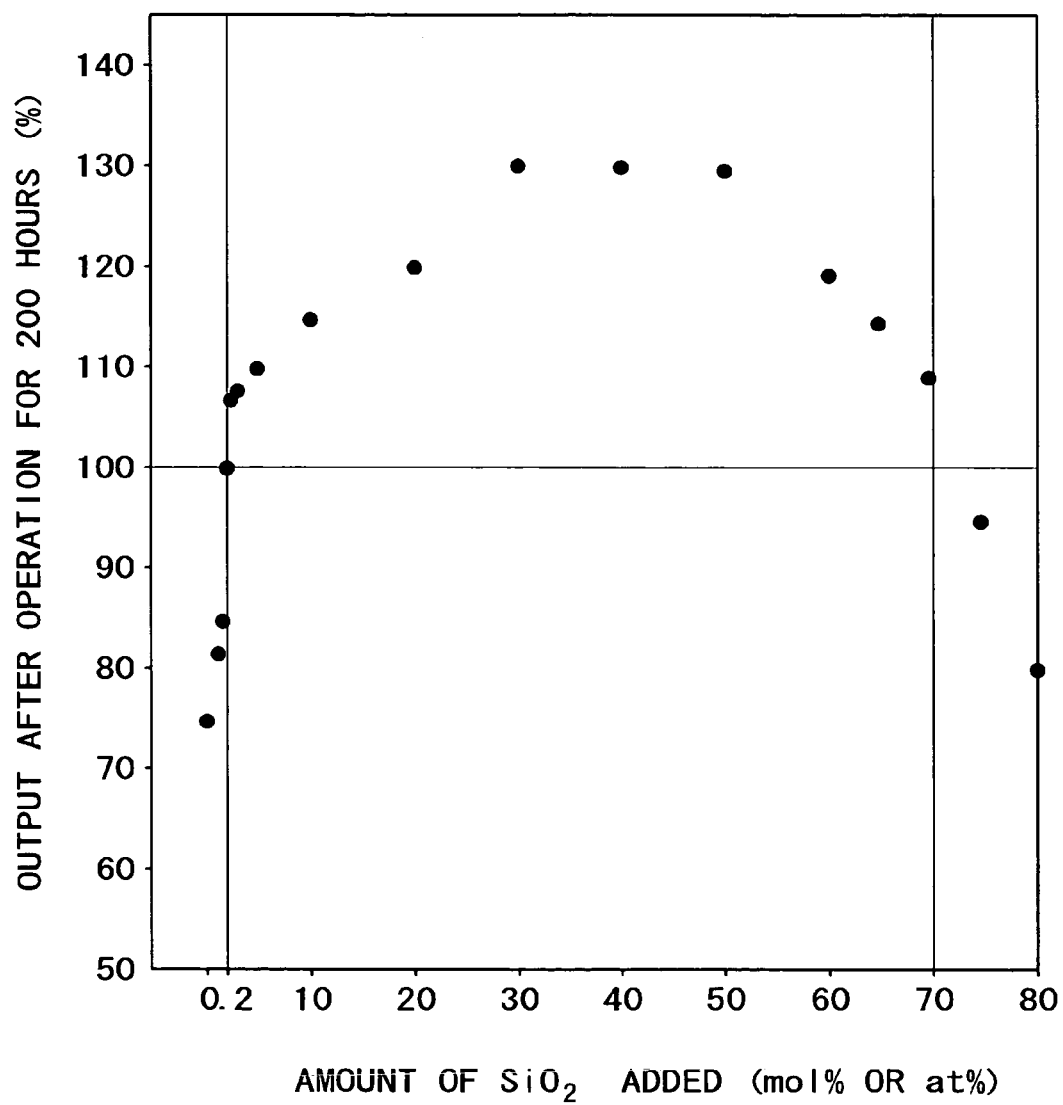
FIG. 15 is a diagram showing the relation between the amount of $SiO_2$ added and the output after operation for 200 hours in an embodiment of the present invention.

In addition, it is apparent from Table 2 and FIG. 15 that sintering is effectively prevented if $SiO_2$ as the additive material is added in a specific amount of 2-70 mol % or at %. This in turn leads to a good catalytic activity and a high output over a long period of time.

The same effect as mentioned above was produced when $SiO_2$ (as the additive material) was replaced by SiO. Also, the same effect as mentioned above was produced when $SiO_2$ was partly replaced by B.

Example 3

The same procedure as in Example 1 was repeated to prepare a fuel cell as shown in FIG. 10, except that B was replaced by $Ga_2O_3$ and the amount of $Ga_2O_3$ was varied as shown in Table 3. The resulting fuel cells were tested for initial output and output after operation for 200 hours. The results are shown in Table 3 and FIG. 16. Incidentally, the initial output (in terms of $mW/cm^2$) generated by the fuel cell which employs the gas-diffusing catalytic electrode containing no $Ga_2O_3$ is regarded as the standard (100%) for relative values.

TABLE 3

| Element added | Amount added (mol %) | Initial output (%) | Output after operation for 200 hours (%) |
|---|---|---|---|
| $Ga_2O_3$ | 0 | 100 | 75 |
| $Ga_2O_3$ | 1 | 100 | 82 |
| $Ga_2O_3$ | 1.5 | 100 | 85 |
| $Ga_2O_3$ | 2.0 | 102 | 95 |
| $Ga_2O_3$ | 2.5 | 106 | 98 |
| $Ga_2O_3$ | 3 | 110 | 108 |
| $Ga_2O_3$ | 5 | 110 | 110 |
| $Ga_2O_3$ | 10 | 110 | 110 |
| $Ga_2O_3$ | 20 | 110 | 110 |
| $Ga_2O_3$ | 30 | 110 | 110 |
| $Ga_2O_3$ | 40 | 110 | 110 |
| $Ga_2O_3$ | 50 | 110 | 110 |
| $Ga_2O_3$ | 60 | 110 | 110 |
| $Ga_2O_3$ | 65 | 110 | 110 |
| $Ga_2O_3$ | 70 | 110 | 110 |
| $Ga_2O_3$ | 75 | 95 | 95 |
| $Ga_2O_3$ | 80 | 80 | 80 |

Example 4

The same procedure as in Example 1 was repeated to prepare a fuel cell as shown in FIG. 10, except that B was replaced by $V_2O_5$ and the amount of $V_2O_5$ was varied as shown in Table 4. The resulting fuel cells were tested for initial output and output after operation for 200 hours. The results are shown in Table 4 and FIG. 17. Incidentally, the initial output (in terms of $mW/cm^2$) generated by the fuel cell which employs the gas-diffusing catalytic electrode containing no $V_2O_5$ is regarded as the standard (100%) for relative values.

TABLE 4

| Element added | Amount added (mol %) | Initial output (%) | Output after operation for 200 hours (%) |
|---|---|---|---|
| $V_2O_5$ | 1 | 100 | 82 |
| $V_2O_5$ | 1.5 | 100 | 85 |
| $V_2O_5$ | 2.0 | 100 | 95 |
| $V_2O_5$ | 2.5 | 100 | 98 |
| $V_2O_5$ | 3 | 100 | 100 |
| $V_2O_5$ | 5 | 100 | 100 |
| $V_2O_5$ | 10 | 100 | 100 |

TABLE 4-continued

| Element added | Amount added (mol %) | Initial output (%) | Output after operation for 200 hours (%) |
|---|---|---|---|
| $V_2O_5$ | 20 | 100 | 100 |
| $V_2O_5$ | 30 | 100 | 100 |
| $V_2O_5$ | 40 | 100 | 100 |
| $V_2O_5$ | 50 | 100 | 100 |
| $V_2O_5$ | 60 | 100 | 100 |
| $V_2O_5$ | 65 | 110 | 110 |
| $V_2O_5$ | 70 | 110 | 110 |
| $V_2O_5$ | 75 | 95 | 95 |
| $V_2O_5$ | 80 | 80 | 80 |

Example 5

The same procedure as in Example 1 was repeated to prepare a fuel cell as shown in FIG. 10, except that B was replaced by $WO_3$ and the amount of $WO_3$ was varied as shown in Table 5. The resulting fuel cells were tested for initial output and output after operation for 200 hours. The results are shown in Table 5 and FIG. 18. Incidentally, the initial output (in terms of mw/cm$^2$) generated by the fuel cell which employs the gas-diffusing catalytic electrode containing no $WO_3$ is regarded as the standard (100%) for relative values.

TABLE 5

| Element added | Amount added (mol %) | Initial output (%) | Output after operation for 200 hours (%) |
|---|---|---|---|
| $WO_3$ | 0 | 100 | 75 |
| $WO_3$ | 1 | 100 | 82 |
| $WO_3$ | 1.5 | 100 | 85 |
| $WO_3$ | 2.0 | 107 | 100 |
| $WO_3$ | 2.5 | 109 | 107 |
| $WO_3$ | 3 | 110 | 108 |
| $WO_3$ | 5 | 110 | 110 |
| $WO_3$ | 10 | 115 | 115 |
| $WO_3$ | 20 | 120 | 120 |
| $WO_3$ | 30 | 130 | 130 |
| $WO_3$ | 40 | 120 | 120 |
| $WO_3$ | 50 | 115 | 115 |
| $WO_3$ | 60 | 110 | 110 |
| $WO_3$ | 65 | 110 | 110 |
| $WO_3$ | 70 | 110 | 110 |
| $WO_3$ | 75 | 95 | 95 |
| $WO_3$ | 80 | 80 | 80 |

It is shown that while Pt as the noble metal material and $Ga_2O_3$, $V_2O_5$, or $WO_3$ as the additive material cannot be made into an alloy by chemical heating because it is solid-insoluble in Pt, they can be made into an alloy by the physical vapor deposition such as sputtering. It is also shown that the first gas-diffusing catalytic electrode pertaining to an embodiment of the present invention, which contains the first conductive catalytic particles pertaining to an embodiment of the present invention which are the conductive powder on the surface of which is deposited by sputtering the catalytic material which is an alloy of Pt as the noble metal material and $Ga_2O_3$, $v_2O_5$, or $WO_3$ as the additive material, prevents the internal self-diffusion of Pt crystal lattice in the catalytic material and hence is hardly subject to sintering. Therefore, it is superior in catalytic activity and output characteristics to the one containing Pt alone.

In this Example, the carbon powder as the conductive powder and the halls as the vibration-amplifying means are placed on the vibrating plane, and the catalytic material is made to adhere to the surface of the carbon powder while they are being vibrated. Therefore, the carbon powder thoroughly vibrates, without staying at one place on the vibrating plane. Thus, it is possible to make the catalytic material adhere uniformly to all of the carbon powder placed in the container.

Figure 16:
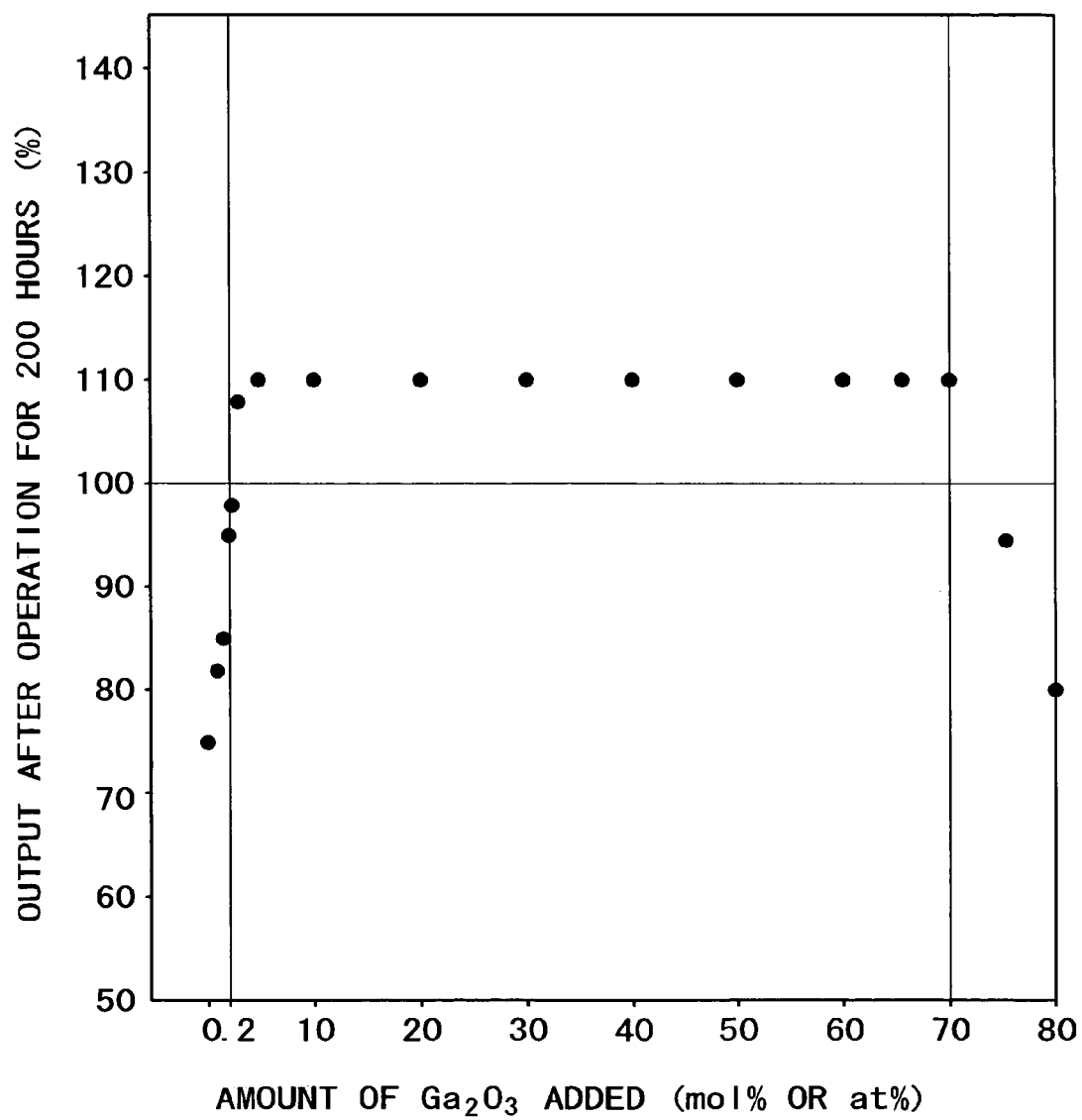
FIG. 16 is a diagram showing the relation between the amount of $Ga_2O_3$ added and the output after operation for 200 hours in an embodiment of the present invention.
Figure 18:
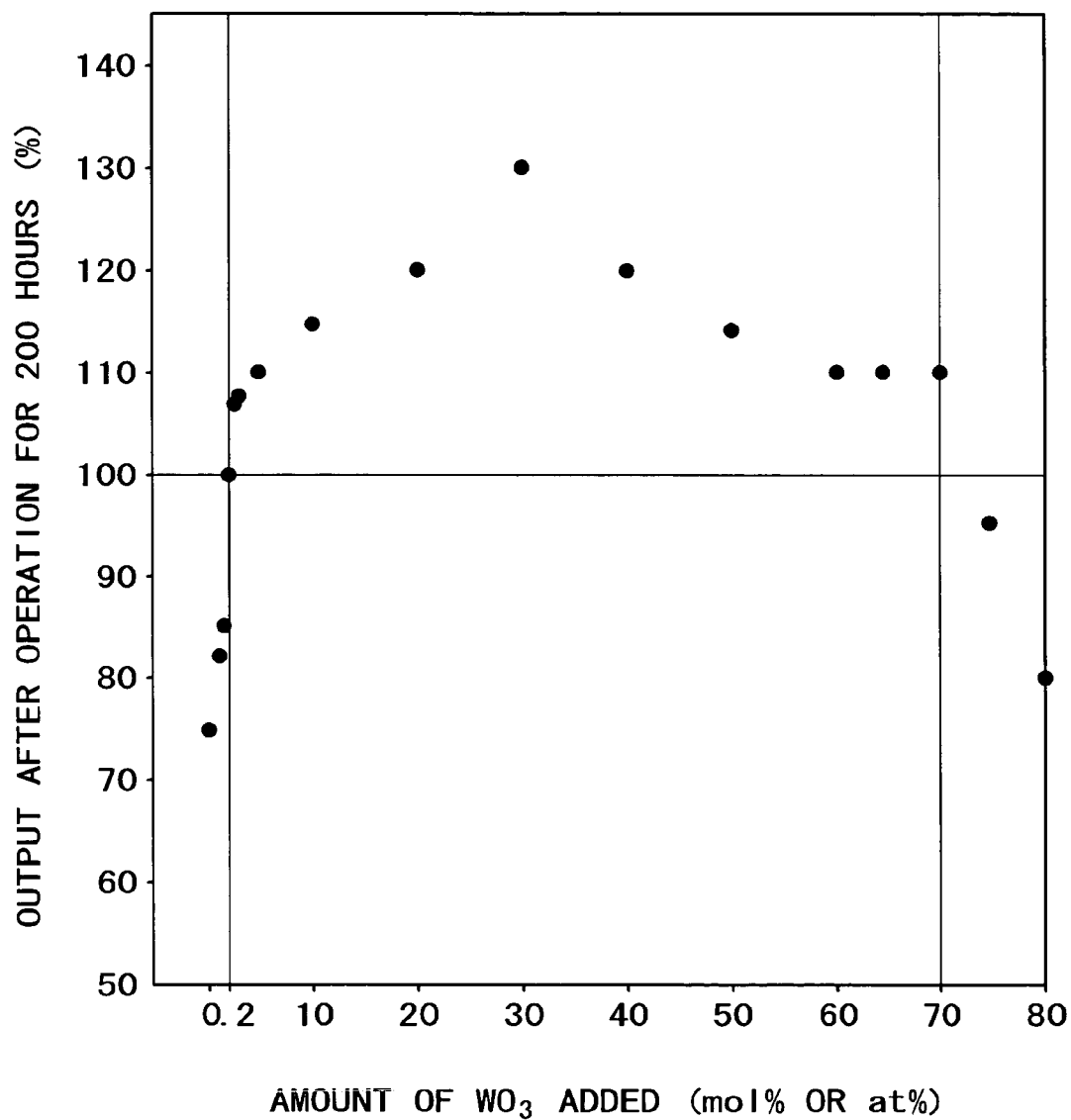
FIG. 18 is a diagram showing the relation between the amount of $WO_3$ added and the output after operation for 200 hours in an embodiment of the present invention.

In addition, it is apparent from Table 3, 4, or 5 and FIG. 16, 17, or 18 that sintering is effectively prevented if $Ga_2O_3$, $V_2O_5$, or $WO_3$ as the additive material is added in a specific amount of about 2 to about 70 mol % or at %. This in turn leads to a good catalytic activity and a high output over a long period of time.

Example 6

An apparatus shown in FIG. 3A was assembled from a sputtering target, a vibrator, and a container. The container was charged with a conductive powder and balls as the vibration-amplifying means. The sputtering target shown in FIG. 3B is a disk 100 mm in diameter of Pt as the MI, which is incorporated with any the additive elements (3 at %) shown in Table 6 below as the MII. The balls are stainless steel balls 3 mm in diameter. The conductive powder is a carbon powder having a surface area of 800 m$^2$/g and an oil absorption value of 360 mL/100 g. Sputtering is conducted with the vibrator generating vibration with an amplitude of ±1 mm and a frequency of 36 Hz.

The container was charged with the carbon powder (1 g) and the stainless steel balls (35 g). Sputtering was carried out for 30 minutes while the carbon powder and stainless steel balls were being vibrated by the vibrator, with the vacuum chamber supplied with argon (at 1 Pa) and the target activated by 400 W RF. After sputtering, it was found that the carbon powder increased in weight to 1.66 g owing to deposition (0.66 g) of the alloy of Pt and the additive element (the MII) thereon. This implies that the treated carbon powder carries the Pt/MII alloy as much as 40 wt %.

A carbon sheet was coated with a mixture of teflon binder and carbon (not carrying platinum) dispersed in a solvent such that the coating layer was 20 μm thick after drying. This coating functions as a layer to prevent spreading.

The Pt/MII alloy-carrying carbon powder, which was obtained as mentioned above, was mixed with perfluorosulfonic acid as a binder and n-propyl alcohol as an organic solvent. The resulting mixture was applied to that side of the carbon sheet on which the layer to prevent spreading was formed. After drying, the coating layer was 20 μm thick. The thus obtained sheet was used in this example as the gas-diffusing catalytic electrode. A fuel cell as shown in FIG. 10 was made, in which the gas-diffusing catalytic electrode was placed on both sides of the ion-exchange membrane (of perfluorosulfonic acid resin). The resulting fuel cell was tested for initial output and output after operation for 200 hours. The results of measurements are shown in Table 6 below. Incidentally, the initial output (in terms of mW/cm$^2$) generated by the fuel cell which employs the gas-diffusing catalytic electrode containing no MII is regarded as the standard (100%) for relative values.

Example 7

The same procedure as in Example 6 was repeated, except that the balls as the vibration-amplifying means were not used. The gas-diffusing catalytic electrode was prepared by sputtering that employs a target as shown in FIG. 3B. This target is a disk (100 mm in diameter) of Pt as the MI incorporated with the additive element (3 at %) as the MII shown in FIG. 7 below. With the gas-diffusing catalytic electrode placed on both sides of the ion exchange membrane, a fuel cell as shown in FIG. 10 was prepared. The fuel cell was tested for initial output and output after operation for 200 hours. The results of measurements are shown in Table 7 below. Incidentally, the initial output (in terms of mW/cm$^2$) generated by the fuel cell which employs the gas-diffusing catalytic electrode containing no additive element as the MII is regarded as the standard (100%) for relative values.

Example 8

The same procedure as in Example 6 was repeated except that the balls as the vibration-amplifying means were not used and vibration was not applied. The gas-diffusing catalytic electrode was prepared by sputtering that employs a target as shown in FIG. 3B. This target is a disk (100 mm in diameter) of Pt as the MI incorporated with the additive element (3 at %) as the MII shown in FIG. 8 below. With the gas-diffusing catalytic electrode placed on both sides of the ion exchange membrane, a fuel cell as shown in FIG. 10 was prepared. The fuel cell was tested for initial output and output after operation for 200 hours. The results of measurements are shown in Table 8 below. Incidentally, the initial output (in terms of mW/cm$^2$) generated by the fuel cell which employs the gas-diffusing catalytic electrode containing no additive element as the MII is regarded as the standard (100%) for relative values.

TABLE 6

(with balls + with vibration)

|  | Element added | Amount added (at %) | Initial output (%) | Output after operation for 200 hours (%) |
| --- | --- | --- | --- | --- |
| — | none | 0 | 100 | 75 |
| MII' | Fe | 3 | 100 | 100 |
|  | Co | 3 | 100 | 100 |
|  | Ni | 3 | 100 | 100 |
|  | Cr | 3 | 100 | 100 |
|  | Al | 3 | 100 | 100 |
| MII" | Hf | 3 | 100 | 100 |

TABLE 7

(without balls + with vibration)

|  | Element added | Amount added (at %) | Initial output (%) | Output after operation for 200 hours (%) |
| --- | --- | --- | --- | --- |
| Example 1 | none | 0 | 100 | 75 |
| MII' | Fe | 3 | 60 | 60 |
|  | Co | 3 | 60 | 60 |
|  | Ni | 3 | 60 | 60 |
|  | Cr | 3 | 60 | 60 |
|  | Al | 3 | 60 | 60 |
| MII" | Hf | 3 | 60 | 60 |

TABLE 8

(without balls + without vibration)

|  | Element added | Amount added (at %) | Initial output (%) | Output after operation for 200 hours (%) |
| --- | --- | --- | --- | --- |
| Example 1 | none | 0 | 100 | 75 |
| MII' | Fe | 3 | 30 | 30 |
|  | Co | 3 | 30 | 30 |
|  | Ni | 3 | 30 | 30 |

TABLE 8-continued (without balls + without vibration)

|  | Element added | Amount added (at %) | Initial output (%) | Output after operation for 200 hours (%) |
| --- | --- | --- | --- | --- |
|  | Cr | 3 | 30 | 30 |
|  | Al | 3 | 30 | 30 |
| MII" | Hf | 3 | 30 | 30 |

It is shown that Pt as the MI and the additive element as the MII can be made into an alloy by the physical vapor deposition such as sputtering. It is also shown that the second gas-diffusing catalytic electrode pertaining to the present invention, which contains the second conductive catalytic particles pertaining to the present invention which are the conductive powder on the surface of which is deposited by sputtering the catalytic material which is an alloy of Pt as the MI and the additive element as the MII, prevents the internal self-diffusion of Pt crystal lattice in the catalytic material and hence is hardly subject to sintering. Therefore, it keeps a high output for a longer time than the one containing Pt alone.

It was also found that the catalytic material can be made to more uniformly adhere to the carbon powder which leads to a higher output if the carbon powder as the conductive powder is given vibration than if the carbon powder is not given vibration when the catalytic material is made to adhere to the surface of the carbon powder.

In addition, the carbon powder underwent more vigorous vibration, without staying at one place on the vibrating plane, if the carbon powder as the conductive powder is vibrated together with the balls as the vibration-amplifying means than if the carbon powder is vibrated without the balls when the catalytic material is made to adhere to the surface of the carbon powder. The result is that the carbon powder placed in the container is entirely and uniformly loaded with the catalytic material. This leads to an improved output.

The same result as mentioned above was obtained when the MII is incorporated with at least one species selected from Fe, Co, Ni, Cr, Al, Cu, Hf, Zr, Ti, V, Nb, Ta, W, Ga, Sn, Ge, Si, Re, Os, Pb, Bi, Sb, Mo, Mn, O, N, F, C, Zn, In, and rare earth elements.

Example 9

The same procedure as in Example 6 was repeated to prepare a fuel cell as shown in FIG. 10, except that the kind and amount of the additive element as the MII were varied as shown in Table 9 below. The resulting fuel cell was tested for initial output and output after operation for 200 hours. The results of measurements are shown in Table 9 and FIG. 19 below. Incidentally, the initial output (in terms of mW/cm$^2$) generated by the fuel cell which employs the gas-diffusing catalytic electrode containing no additive element (as the MII) is regarded as the standard (100%) for relative values.

TABLE 9

|  | Element added | Amount added (at %) | Initial output (%) | Output after operation for 200 hours (%) |
| --- | --- | --- | --- | --- |
| — | none | 0 | 100 | 75 |
| MII' | Fe | 0.3 | 100 | 75 |
|  | Fe | 0.4 | 100 | 76 |
|  | Fe | 0.5 | 100 | 86 |
|  | Fe | 0.6 | 100 | 89 |

TABLE 9-continued

| | Element added | Amount added (at %) | Initial output (%) | Output after operation for 200 hours (%) |
|---|---|---|---|---|
| | Fe | 0.7 | 100 | 92 |
| | Co | 0.3 | 100 | 75 |
| | Co | 0.4 | 100 | 76 |
| | Co | 0.5 | 100 | 86 |
| | Co | 0.6 | 100 | 89 |
| | Co | 0.7 | 100 | 92 |
| MII" | Hf | 0.3 | 100 | 80 |
| | Hf | 0.4 | 100 | 76 |
| | Hf | 0.5 | 100 | 86 |
| | Hf | 0.6 | 100 | 89 |
| | Hf | 0.7 | 100 | 92 |

Figure 19:
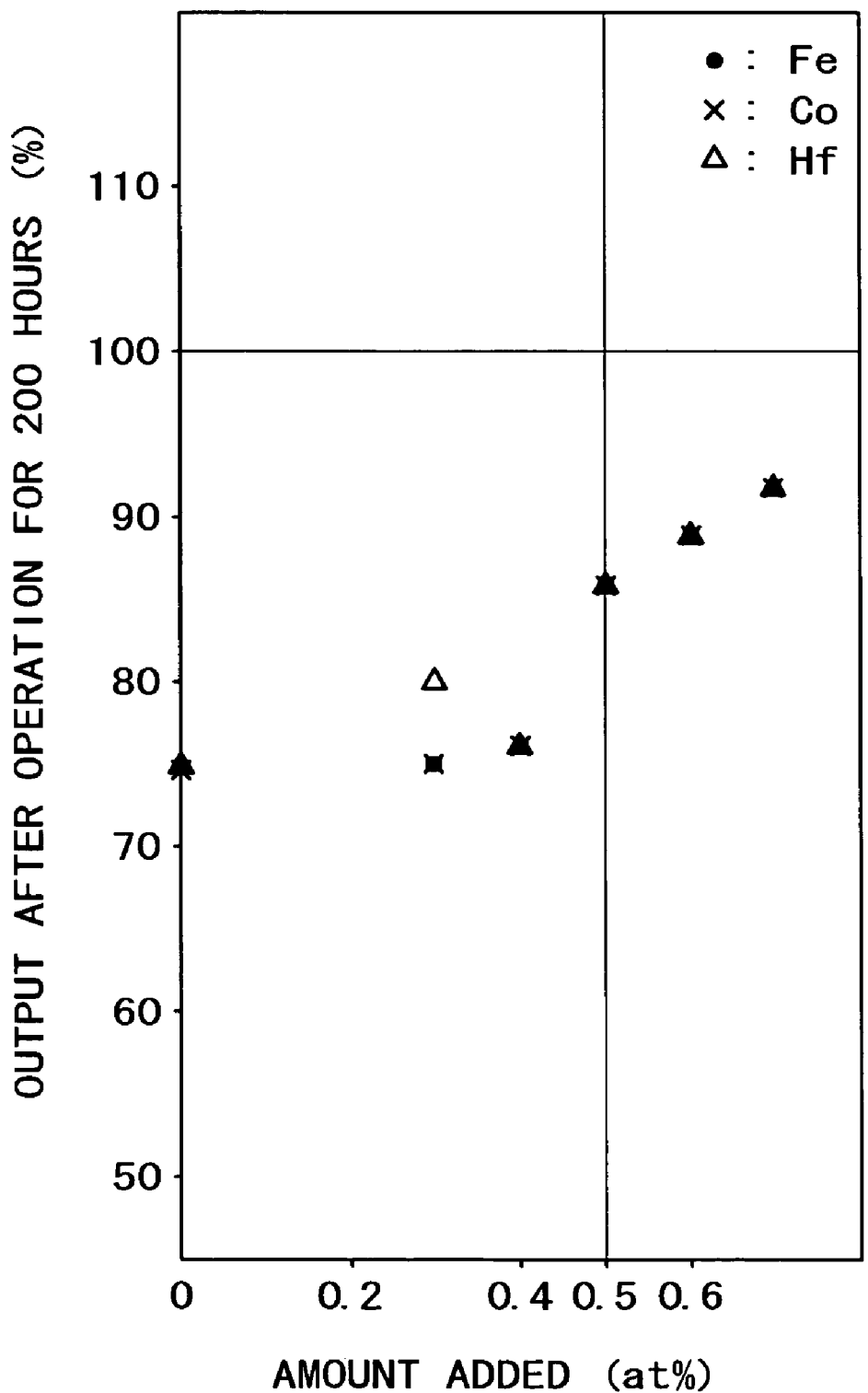
FIG. 19 is a diagram showing the relation between the amount of MII added and the output after operation for 200 hours in an embodiment of the present invention.

It is apparent from Table 9 and FIG. 19 that the additive element as the MII added in a specific amount no less than 0.5 at % produces a remarkable effect in preventing sintering and contributes to a good catalytic performance, permitting the fuel cell to keep a high output for a long time. With an amount less than 0.5 at %, the MII does not produce the effect of preventing sintering as desired.

Example 10

The same procedure as in Example 6 was repeated to prepare a fuel cell as shown in FIG. 10, except that the MII was Fe belonging to the MII' and the amount of Fe was varied as shown in Table 10 below. The resulting fuel cell was tested for initial output and output after operation for 200 hours. The results of measurements are shown in Table 10 and FIG. 20 below. Incidentally, the initial output (in terms of mW/cm²) generated by the fuel cell which employs the gas-diffusing catalytic electrode containing no Fe is regarded as the standard (100%) for relative values.

TABLE 10

| Element added | Amount added (at %) | Initial output (%) | Output after operation for 200 hours (%) |
|---|---|---|---|
| None | 0 | 100 | 75 |
| Fe | 10 | 105 | 105 |
| Fe | 20 | 110 | 110 |
| Fe | 30 | 120 | 120 |
| Fe | 40 | 120 | 120 |
| Fe | 50 | 120 | 120 |
| Fe | 56 | 115 | 115 |
| Fe | 60 | 110 | 110 |
| Fe | 62 | 83 | 83 |
| Fe | 70 | 80 | 80 |

It is apparent from Table 10 and FIG. 20 that the Fe belonging to the MII' as the MII added in a specific amount no less than 60 at % produces a remarkable effect in preventing sintering, contributing to a higher output. With an excess amount, sintering can be prevented but the output is lowered.

In this example, the same result as mentioned above was obtained when the Fe belonging to the MII' as the MII is replaced by at least one species selected from Fe, Co, Ni, Cr, Al, Sn, Cu, Mo, W, O, N, F, and C.

Example 11

The same procedure as in Example 6 was repeated to prepare a fuel cell as shown in FIG. 10, except that the MII was Hf belonging to the MII" and the amount of Hf was varied as shown in Table 11 below. The resulting fuel cell was tested for initial output and output after operation for 200 hours. The results of measurements are shown in Table 11 and FIG. 21 below. Incidentally, the initial output (in terms of mW/cm²) generated by the fuel cell which employs the gas-diffusing catalytic electrode containing no Hf is regarded as the standard (100%) for relative values.

TABLE 11

| Element added | Amount added (at %) | Initial output (%) | Output after operation for 200 hours (%) |
|---|---|---|---|
| None | 0 | 100 | 75 |
| Hf | 5 | 100 | 100 |
| Hf | 10 | 95 | 95 |
| Hf | 15 | 90 | 90 |
| Hf | 18 | 88 | 88 |
| Hf | 20 | 85 | 85 |
| Hf | 22 | 76 | 76 |
| Hf | 25 | 70 | 70 |
| Hf | 30 | 60 | 60 |

Figure 21:
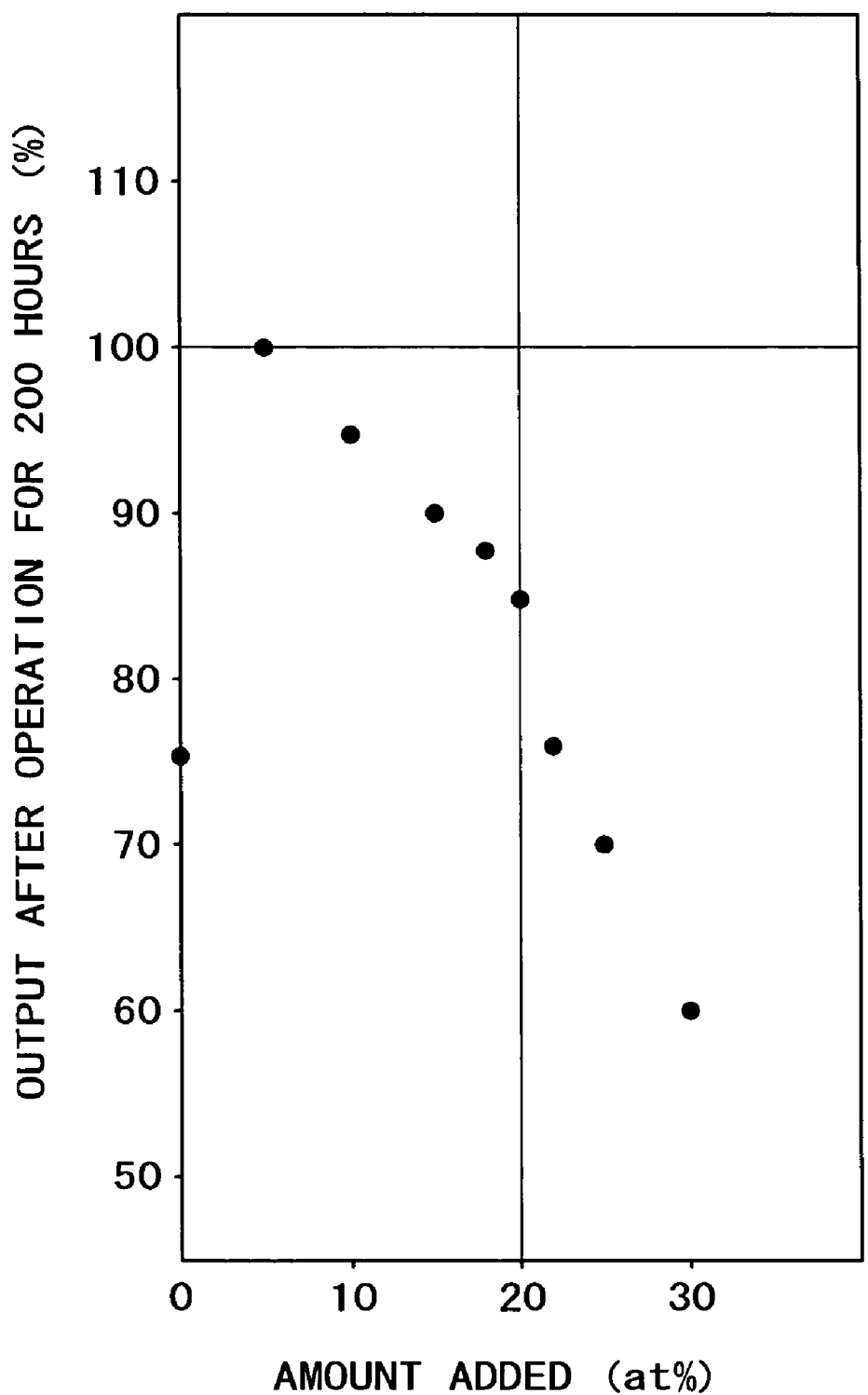
FIG. 21 is a diagram showing the relation between the amount of MII" added and the output after operation for 200 hours in an embodiment of the present invention.
Figure 24A:
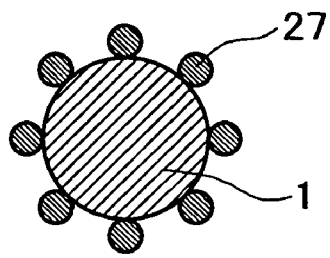
FIGS. 24A and 24B are schematic sectional views showing the conductive catalytic particles which are obtained by causing a carbon powder to carry platinum by the conventional process.
Figure 24B:
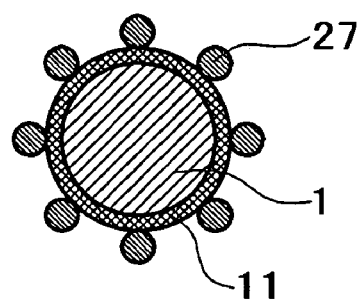
Figure 25:
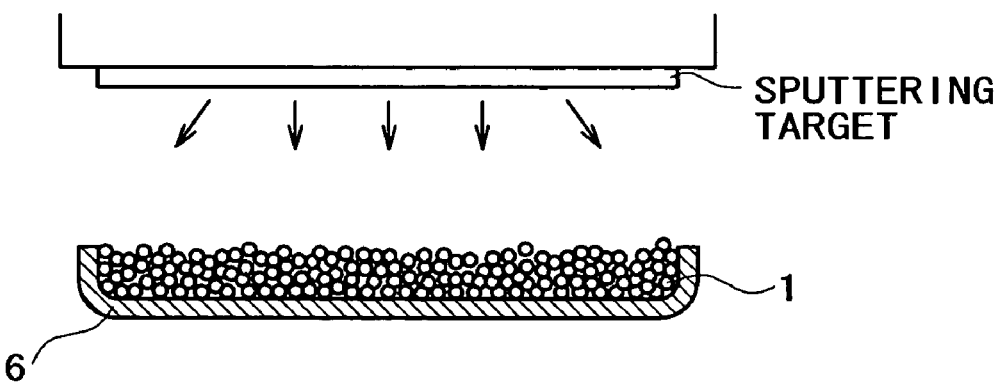
FIG. 25 is a schematic sectional view showing the apparatus used for production of the conductive catalytic particles as disclosed in Japanese Patent Application No. 2000-293517.
Figure 26A:
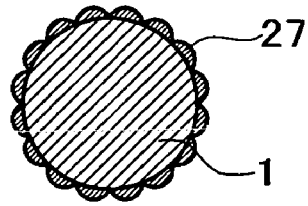
FIGS. 26A and 26B are schematic sectional views showing the conductive catalytic particles as disclosed in Japanese Patent Application No. 2000-293517.
Figure 26B:
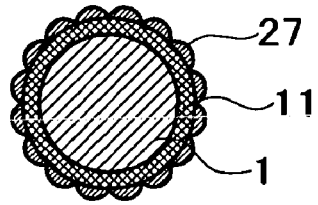

It is apparent from Table 11 and FIG. 21 that the Hf belonging to the MII" as the MII added in a specific amount no less than 20 at % produces a remarkable effect in preventing sintering, contributing to a higher output. With an excess amount, sintering can be prevented but the output is lowered.

In this example, the same result as mentioned above was obtained when the Hf belonging to the MII" as the MII is replaced by at least one species selected from Hf, Zr, Ti, V, Nb, Ta, Ga, Ge, Si, Re, Os, Pb, Bi, Sb, Mn, and rare earth elements.

Example 12

The same procedure as in Example 6 was repeated to prepare a fuel cell as shown in FIG. 10, except that the MII was a mixture of Fe belonging to the MII' and Hf belonging to the MII" and the amount of each additive element was varied as shown in Tables 12 and 13 below. The resulting fuel cell was tested for initial output and output after operation for 200 hours. The results of measurements are shown in Tables 12 and 13 and FIGS. 22 and 23 below. Incidentally, the initial output (in terms of mW/cm²) generated by the fuel cell which employs the gas-diffusing catalytic electrode not containing the mixture of Fe belonging to the MII' and Hf belonging to the MII" is regarded as the standard (100%) for relative values.

TABLE 12

| (b + c ≧ 0.5 at %) | | |
|---|---|---|
| Elements added and amount added (at %) | Initial output (%) | Output after operation for 200 hours (%) |
| None | 100 | 75 |
| Hf (0.2 at %) + Fe (0.2 at %) | 100 | 76 |
| Hf (0.2 at %) + Fe (0.3 at %) | 100 | 86 |
| Hf (0.2 at %) + Fe (0.4 at %) | 100 | 89 |
| Hf (0.2 at %) + Fe (0.5 at %) | 100 | 92 |

TABLE 12

(b + c ≦ 60 at %)

| Elements added and amount added (at %) | Initial output (%) | Output after operation for 200 hours (%) |
|---|---|---|
| None | 100 | 75 |
| Hf (10 at %) + Fe (10 at %) | 110 | 110 |
| Hf (10 at %) + Fe (20 at %) | 120 | 120 |
| Hf (10 at %) + Fe (30 at %) | 120 | 120 |
| Hf (10 at %) + Fe (40 at %) | 120 | 120 |
| Hf (10 at %) + Fe (46 at %) | 115 | 115 |
| Hf (10 at %) + Fe (50 at %) | 110 | 110 |
| Hf (10 at %) + Fe (52 at %) | 83 | 83 |
| Hf (10 at %) + Fe (60 at %) | 80 | 80 |

It is apparent from the foregoing that the mixture of Fe as the MII' and Hf as the MII", which serves as the MII ($Fe_a$—$Hf_b$), produces a remarkable effect in preventing sintering, contributing to a higher output, as in the case where these additive elements are used individually. When the amount of the MII is specified in a specific range of 0.5 at %≦b+c≦60 at %, the catalytic performance and output are improved and the effect of preventing sintering is enhanced. This permits the fuel cell to produce a high output for a longer time. It is apparent from Table 12 and FIG. 22 that when the value of b+c is smaller than 0.5 at %, the MII' and MII" do not produce the effect of preventing sintering because their amount is too small. It is also apparent from Table 13 and FIG. 23 that when the value of b+c is larger than 60 at %, the MII' and MII" lower the catalytic action and hence reduce the output because their amount is excessive.

The examples explained above may be variously modified on the basis of the technical idea according to the present invention.

For instance, Examples 1 to 5 may be modified such that the Pt as the noble metal material is replaced by Ir or Rh, or the carbon powder as the conductive powder is replaced by ITO or $SnO_2$.

Also, Examples 6 to 12 may modified such that the MII' as the additive element is replaced by at least one specifies selected from Fe, Co, Ni, Cr, Al, Sn, Cu, Mo, W, O, N, F, and C, and the MII" as the additive element is replaced by at least one specifies selected from Hf, Zr, Ti, V, Nb, Ta, Ga, Ge, Si, Re, Os, Pb, Bi, Sb, Mn, and rare earth elements.

Also, the Pt as the MI may be replaced by at least one species selected from noble metal elements such as Ir, Pd, Rh, Au, and Ru, and the carbon powder as the conductive powder may be replaced by the ITO or $SnO_2$.

Also, the balls as the vibration-amplifying means may be replaced by the gadget formed in an approximately spiral pattern as shown in FIG. 7, the gadget formed in an approximately concentric pattern as shown in FIG. 8, or the gadget formed in a turned-around pattern as shown in FIG. 9. Any of these alternatives and the like can produce as good results as in Examples 1 to 12.

Moreover, the first or second gas-diffusing catalytic electrode pertaining to an embodiment of the present invention may be applied to not only the fuel cell but also the hydrogen generating apparatus in which the reverse reaction of the fuel cell takes place.

According to an embodiment of the present invention, the conductive catalytic particles are produced by depositing on the surface of a conductive powder a noble metal material and an additive material which is thermally solid-insoluble in the noble metal at the same time by physical vapor deposition. The advantage of this production process is that the solid-insoluble additive material which originally does not form alloy with the noble metal material even when heated can be compulsorily introduced into the crystal lattice of the noble metal material. Thus, this production process yields the conductive catalytic particles with the catalytic material (which is an alloy of the noble metal material and the additive material) adhering to the surface of the conductive powder. The thus obtained conductive catalytic particles are very little subject to sintering because the catalytic material contains the additive material so that the noble metal material in the catalytic material is protected from self-diffusion in the crystal lattice. Incidentally, the conventional chemical process for adhesion does not give the alloy because it cannot introduce the solid-insoluble additive material into the noble metal material.

The advantage of the process is due to the fact that the surface of the conductive powder is coated with the noble metal material and the additive material which is thermally solid-insoluble in the noble metal at the same time by physical vapor deposition. The process in this manner prevents the grain growth of the noble metal material at the time of deposition, which leads to an outstanding catalytic activity.

Another advantage of the process is due to the fact that the catalytic material is made to deposit on the surface of the conductive powder by physical vapor deposition. Physical vapor deposition permits a catalytic material with good crystallinity to deposit on the surface of the conductive powder at a low temperature. Therefore, the first conductive catalytic particles of the present invention thus obtained produce a good catalytic activity with a less amount of catalytic material. In addition, the resulting catalytic material has a sufficiently large area for contact with gas or has a large specific surface area contributing to reaction. This leads to an improved catalytic activity.

According to another embodiment of the present invention, the conductive catalytic particles are produced by depositing on the surface of a conductive powder the MI and the MII by physical vapor deposition at the same time. The advantage of this production process is that the MII can be compulsorily introduced into the crystal lattice of MI. Thus, this production process yields the conductive catalytic particles with the catalytic material which is an alloy of the MI and the MII adhering to the surface of the conductive powder. The thus obtained conductive catalytic particles are very little subject to sintering because the catalytic material contains the MII so that the MI in the catalytic material is protected from movement of dislocations and self-diffusion in the crystal lattice.

The advantage of the process is due to the fact that the catalytic material is made to deposit on the surface of the conductive powder by physical vapor deposition. Physical vapor deposition permits a catalytic material with good crystallinity to deposit on the surface of the conductive powder at a low temperature. Therefore, the second conductive catalytic particles thus obtained produce a good catalytic activity with a less amount of catalytic material. In addition, the resulting catalytic material has a sufficiently large area for contact with gas or has a large specific surface area contributing to reaction. This leads to an improved catalytic activity.

The electrochemical device, in which at least one of the electrodes is the first or second gas-diffusing electrode pertaining to an embodiment of the present invention, produces the effect of preventing the occurrence of sintering. Therefore, it has good output characteristics and keeps them over a long period of time.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A process for producing conductive catalytic particles, the process comprising:
    vibrating a conductive powder;
    coating the conductive powder with an ionic conductor; and
    adhering a noble metal and an additive component at the same time to a surface of the ionic conductor coated on the conductive powder by physical vapor deposition in an amount ranging from 10 weight % to 1000 weight % of the conductive powder,
    wherein the noble metal is selected from the group consisting of Pt, Ir, and Rh,
    wherein the additive component is selected from the group consisting of boron, silicon oxide, vanadium oxide, tungsten oxide, gallium oxide, and mixtures thereof,
    wherein the noble metal and the additive component do not form a solid solution thereby forming the catalytic particles free of sintering, and
    wherein the conductive powder is selected from the group consisting of carbon having a specific surface area greater than or equal to about 300 $m^2/g$, ITO and $SnO_2$.

2. The process for producing conductive catalytic particles as defined in claim 1, wherein the conductive powder is vibrated together with vibration-amplifying means.

3. The process for producing conductive catalytic particles as defined in claim 2, wherein one or more balls are used as the vibration-amplifying means and a mixture of the conductive powder and the balls undergoes vibration in a container.

4. The process for producing conductive catalytic particles as defined in claim 3, wherein the balls are selected from the group consisting of ceramic, metallic and combinations thereof and wherein the balls range from about 1 to about 15 mm in diameter.

5. The process for producing conductive catalytic particles as defined in claim 2, wherein the vibration-amplifying means is an approximately flat gadget formed in any one of an approximately spiral, concentric, and turned-around pattern, which is fixed to the container, with at least a portion thereof remaining unfixed, and the conductive powder is placed on the gadget for vibration.

6. The process for producing conductive catalytic particles as defined in claim 5, wherein the gadget includes a wire that ranges from about 1 to about 10 mm in diameter.

7. The process for producing conductive catalytic particles as defined in claim 5, wherein the gadget has a shape such that an outside diameter of the gadget is smaller by about 5 mm than an inside diameter of a container that contains the gadget and that one or more adjacent wires of the gadget are arranged at intervals of about 5 to about 15 mm.

8. The process for producing conductive catalytic particles as defined in claim 2, wherein the vibration amplifying means has a thickness equivalent to about 10 to about 70% of a layer thickness of the conductive powder.

9. The process for producing conductive catalytic particles as defined in claim 1, wherein an area of the vibration amplifying means accounts for about 30 to about 80% of an area over which the conductive powder is distributed.

10. The process for producing conductive catalytic particles as defined in claim 1, wherein the vibration is carried out at a frequency of about 5 to about 200 Hz.

11. The process for producing conductive catalytic particles as defined in claim 1, wherein the vibration is carried out at an amplitude of about 0.5 to about 20 mm.

12. The process for producing conductive catalytic particles as defined in claim 1, wherein the conductive powder has an electrical resistance of lower than about $10^{-3}$ Ωm.

13. The process for producing conductive catalytic particles as defined in claim 1, wherein the conductive powder is carbon with a specific surface area greater than or equal to about 300 $m^2/g$.

14. The process for producing conductive catalytic particles as defined in claim 1, wherein the conductive powder is carbon with an oil absorption value greater than or equal to about 200 mL/100 g.

15. The process for producing conductive catalytic particles as defined in claim 1, wherein the additive component prevents the noble metal from growing in grain size at the time of deposition on the surface of the conductive powder.

16. The process for producing conductive catalytic particles as defined in claim 1, wherein the physical vapor deposition of the noble metal and the additive component is performed by sputtering from a target comprised of the noble metal, the target including a plurality of additive component sections formed in the target.

17. The process for producing conductive catalytic particles as defined in claim 1, wherein the additive component is B and is in an amount ranging from 2-70 at %.

18. The process for producing conductive catalytic particles as defined in claim 17, wherein the B is in an amount ranging from 30-50 at %.

19. The process for producing conductive catalytic particles as defined in claim 1, wherein the additive component is $SiO_2$ and is in an amount ranging from 2-70 at %.

20. The process for producing conductive catalytic particles as defined in claim 19, wherein the $SiO_2$ is in an amount ranging from 30-50 at %.

21. The process for producing conductive catalytic particles as defined in claim 1, wherein the additive component is $Ga_2O_3$ and is in an amount ranging from 2-70 at %.

22. The process for producing conductive catalytic particles as defined in claim 1, wherein the additive component is $V_2O_5$ and is in an amount ranging from 3-70 at %.

23. The process for producing conductive catalytic particles as defined in claim 22, wherein the $V_2O_5$ is in an amount ranging from 65-70 at %.

24. The process for producing conductive catalytic particles as defined in claim 1, wherein the additive component is $WO_3$ and is in an amount ranging from 3-70 at %.

25. The process for producing conductive catalytic particles as defined in claim 24, wherein the $WO_3$ is in an amount ranging from 20-40 at %.

* * * * *